(12) United States Patent
Kato

(10) Patent No.: US 8,619,470 B2
(45) Date of Patent: Dec. 31, 2013

(54) SEMICONDUCTOR MEMORY DEVICE WITH LONG DATA HOLDING PERIOD

(75) Inventor: Kiyoshi Kato, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 371 days.

(21) Appl. No.: 13/161,616

(22) Filed: Jun. 16, 2011

(65) Prior Publication Data

US 2011/0317474 A1     Dec. 29, 2011

(30) Foreign Application Priority Data

Jun. 23, 2010   (JP) .................................. 2010-142196

(51) Int. Cl.
*G11C 16/04*     (2006.01)

(52) U.S. Cl.
USPC ............... 365/185.17; 365/185.18; 365/185.2

(58) Field of Classification Search
USPC ............. 365/185.17, 185.05, 185.18, 185.24, 365/185.2
See application file for complete search history.

(56) References Cited

U.S. PATENT DOCUMENTS

| | | | |
|---|---|---|---|
| 5,712,817 A | 1/1998 | Suh | |
| 5,731,856 A | 3/1998 | Kim et al. | |
| 5,744,864 A | 4/1998 | Cillessen et al. | |
| 6,127,702 A | 10/2000 | Yamazaki et al. | |
| 6,127,857 A * | 10/2000 | Ogawa et al. | 327/94 |
| 6,294,274 B1 | 9/2001 | Kawazoe et al. | |
| 6,563,174 B2 | 5/2003 | Kawasaki et al. | |
| 6,576,943 B1 | 6/2003 | Ishii et al. | |
| 6,727,522 B1 | 4/2004 | Kawasaki et al. | |
| 6,876,023 B2 | 4/2005 | Ishii et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,262,463 B2 | 8/2007 | Hoffman | |

(Continued)

FOREIGN PATENT DOCUMENTS

| CN | 1146605 A | 4/1997 |
|---|---|---|
| CN | 1853278 A | 10/2006 |

(Continued)

OTHER PUBLICATIONS

International Search Report, PCT Application No. PCT/JP2011/063754, dated Sep. 20, 2011, 4 pages.

(Continued)

*Primary Examiner* — Andrew Q Tran

(74) *Attorney, Agent, or Firm* — Fish & Richardson P.C.

(57) ABSTRACT

A semiconductor device includes a source line, a bit line, and first to m-th (m is a natural number) memory cells connected in series between the source line and the bit line. Each of the first to m-th memory cells includes a first transistor having a first gate terminal, a first source terminal, and a first drain terminal, a second transistor having a second gate terminal, a second source terminal, and a second drain terminal, and a capacitor. The node of the k-th memory cell is supplied with a potential higher than that of the second gate terminal of the k-th memory cell in a data holding period in which the second gate terminal is supplied with a potential at which the second transistor is turned off.

17 Claims, 13 Drawing Sheets

(56) References Cited

U.S. PATENT DOCUMENTS

| | | |
|---|---|---|
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,564,055 B2 | 7/2009 | Hoffman |
| 7,674,650 B2 | 3/2010 | Akimoto et al. |
| 7,732,819 B2 | 6/2010 | Akimoto et al. |
| 7,791,074 B2 | 9/2010 | Iwasaki |
| 7,935,582 B2 | 5/2011 | Iwasaki |
| 7,956,361 B2 | 6/2011 | Iwasaki |
| 8,259,487 B2 * | 9/2012 | Fujita ............................ 365/154 |
| 8,339,845 B2 * | 12/2012 | Kwon ...................... 365/185.03 |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2003/0227041 A1 | 12/2003 | Atwood et al. |
| 2004/0038446 A1 | 2/2004 | Takeda et al. |
| 2004/0127038 A1 | 7/2004 | Carcia et al. |
| 2004/0164326 A1 | 8/2004 | Atwood et al. |
| 2005/0017244 A1 | 1/2005 | Hoffman et al. |
| 2005/0017302 A1 | 1/2005 | Hoffman |
| 2005/0199959 A1 | 9/2005 | Chiang et al. |
| 2005/0205921 A1 | 9/2005 | Ishii et al. |
| 2005/0237786 A1 | 10/2005 | Atwood et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0267699 A1 | 11/2007 | Hoffman |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0045397 A1 | 2/2009 | Iwasaki |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0148171 A1 | 6/2010 | Hayashi et al. |
| 2010/0276689 A1 | 11/2010 | Iwasaki |
| 2010/0279462 A1 | 11/2010 | Iwasaki |
| 2011/0128782 A1 * | 6/2011 | Goda et al. ............... 365/185.02 |
| 2011/0193082 A1 | 8/2011 | Iwasaki |

FOREIGN PATENT DOCUMENTS

| | | |
|---|---|---|
| CN | 1906770 A | 1/2007 |
| CN | 101258607 A | 9/2008 |
| CN | 101859711 A | 10/2010 |
| EP | 1 649 519 A1 | 4/2006 |
| EP | 1 714 326 A1 | 10/2006 |
| EP | 1 737 044 A1 | 12/2006 |
| EP | 1 915 784 A1 | 4/2008 |
| EP | 2 226 847 A2 | 9/2010 |
| EP | 2 339 639 A2 | 6/2011 |
| JP | 57-105889 A | 7/1982 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 08-330445 A | 12/1996 |
| JP | 11-505377 | 5/1999 |
| JP | 2000-044236 A | 2/2000 |
| JP | 2000-150900 A | 5/2000 |
| JP | 2000-269457 A | 9/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-014094 A | 1/2004 |
| JP | 2004-103957 A | 4/2004 |
| JP | 2004-273614 A | 9/2004 |
| JP | 2004-273732 A | 9/2004 |
| JP | 2006-528843 A | 12/2006 |
| JP | 2007-103918 A | 4/2007 |
| JP | 2007-519256 A | 7/2007 |
| JP | 2010-183108 A | 8/2010 |
| KR | 0147352 B1 | 5/1998 |
| KR | 2006-0066064 A | 6/2006 |
| KR | 2006-0132659 A | 12/2006 |
| KR | 2008-0053355 A | 6/2008 |
| WO | 00/55920 A1 | 9/2000 |
| WO | 2004/114391 A1 | 12/2004 |
| WO | 2005/015643 A1 | 2/2005 |
| WO | 2005/074038 A1 | 8/2005 |
| WO | 2007/029844 A1 | 3/2007 |

(56) References Cited

FOREIGN PATENT DOCUMENTS

OTHER PUBLICATIONS

Written Opinion, PCT Application No. PCT/JP2011/063754, dated Sep. 20, 2011, 5 pages.
Nomura, K et al., "Thin-Film Transistor Fabricated in Single-Crystalline Transparent Oxide Semiconductor," Science, May 23, 2003, vol. 300, No. 5623, pp. 1269-1272.
Nomura, K et al., "Room-Temperature Fabrication of Transparent Flexible Thin-Film Transistors Using Amorphous Oxide Semiconductors," Nature, Nov. 25, 2004, vol. 432, pp. 488-492.
Ishii, T et al., "A Poly-Silicon TFT With a Sub-5-nm Thick Channel for Low-Power Gain Cell Memory in Mobile Applications," IEEE Transactions on Electron Devices, Nov. 1, 2004, vol. 51, No. 11, pp. 1805-1810.
Kim, W et al., "An Experimental High-Density DRAW Cell with a Built-in Gain Stage," IEEE Journal of Solid-State Circuits, Aug. 1, 1994, vol. 29, No. 8, pp. 978-981.
Shukuri, S et al., "A Complementary Gain Cell Technology for Sub-1 V Supply DRAMs," IEDM 92: Technical Digest of International Electron Devices Meeting, Dec. 13, 1992, pp. 1006-1008.
Shukuri, S et al., "A Semi-Static Complementary Gain Cell Technology for Sub-1 V Supply DRAM's," IEEE Transactions on Electron Devices, Jun. 1, 1994, vol. 41, No. 6, pp. 926-931.
Asakuma, N et al., "Crystallization and Reduction of Sol-Gel-Derived Zinc Oxide Films by Irradiation With Ultraviolet Lamp," Journal of Sol-Gel Science and Technology, 2003, vol. 26. pp. 181-184.
Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.
Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.
Cho, D et al., "21.2: AL and SN-Doped Zinc Indium Oxide Thin Film Transistors for Amoled Back-Plane," SID Digest '09 : SID International Symposium Digest of Technical Papers, May 31, 2009, pp. 280-283.
Clark, S et al., "First Principles Methods Using Castep," Zeitschrift fur Kristallographie, 2005, vol. 220, pp. 567-570.
Coates. D et al., Optical Studies of the Amorphous Liquid-Cholesteric Liquid Crystal Transition: The "Blue Phase," Physics Letters, Sep. 10, 1973, vol. 45A, No. 2, pp. 115-116.
Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.
Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.
Fortunato, E et al., "Wide-Bandgap High-Mobility ZnO Thin-Film Transistors Produced At Room Temperature," Appl. Phys. Lett. (Applied Physics Letters), Sep. 27, 2004, vol. 85, No. 13, pp. 2541-2543.
Fung, T et al., "2-D Numerical Simulation of High Performance Amorphous In-Ga-Zn-O TFTs for Flat Panel Displays," AM-FPD '08 Digest of Technical Papers, Jul. 2, 2008, pp. 251-252, The Japan Society of Applied Physics.
Godo, H et al., "P-9: Numerical Analysis on Temperature Dependence of Characteristics of Amorphous In-Ga-Zn-Oxide TFT," SID Digest '09 : SID International Symposium Digest of Technical Papers, May 31, 2009, pp. 1110-1112.
Godo, H et al., "Temperature Dependence of Characteristics and Electronic Structure for Amorphous In-Ga-Zn-Oxide TFT," AM-FPD '09 Digest of Technical Papers, Jul. 1, 2009, pp. 41-44.
Hayashi, R et al., "42.1: Invited Paper: Improved Amorphous In-Ga-Zn-O TFTs," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTS) for AMLCDS," Journal of the SID , 2007, vol. 15, No. 1, pp. 17-22.
Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.
Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.
Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.
Ikeda., T et al., "Full-Functional System Liquid Crystal Display Using CG-Silicon Technology," SID Digest '04 : SID International Symposium Digest of Technical Papers, 2004, vol. 35, pp. 860-863.
Janotti, A et al., "Native Point Defects in ZnO," Phys. Rev. B (Physical Review. B), 2007, vol. 76, No. 16, pp. 165202-1-165202-22.
Janotti, A et al., "Oxygen Vacancies in ZnO," Appl. Phys. Lett. (Applied Physics Letters), 2005, vol. 87, pp. 122102-1-122102-3.
Jeon, S et al., "180nm Gate Length Amorphous InGaZnO Thin Film Transistor for High Density Image Sensor Applications," IEDM 10: Technical Digest of International Electron Devices Meeting, Dec. 6, 2010, pp. 504-507.
Jeong, J et al., "3.1: Distinguished Paper: 12.1-Inch WXGA AMOLED Display Driven by Indium-Gallium-Zinc Oxide TFTs Array," SID Digest '08 : SID International Symposium Digest of Technical Papers, May 20, 2008, vol. 39, No. 1, pp. 1-4.
Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.
Kanno, H et al., "White Stacked Electrophosphorecent Organic Light-Emitting Devices Employing MOO3 As a Charge-Generation Layer," Adv. Mater. (Advanced Materials), 2006, vol. 18, No. 3, pp. 339-342.
Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.
Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.
Kikuchi, H et al., "Polymer-Stabilized Liquid Crystal Blue Phases," Nature Materials, Sep. 1, 2002, vol. 1, pp. 64-68.
Kim, S et al., "High-Performance oxide thin film transistors passivated by various gas plasmas," the Electrochemical Society, 214th ECS Meeting, 2008, No. 2317, 1 page.
Kimizuka, N et al., "Spinel,YBFE2O4, and YB2FE3O7 Types of Structures for Compounds in the IN2O3 and SC2O3-A2O3-BO Systems [A; Fe, Ga, or Al; B: Mg, Mn, Fe, Ni, Cu,or Zn] At Temperatures Over 1000° C.," Journal of Solid State Chemistry, 1985, vol. 60, pp. 382-384.
Kimizuka, N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3-ZnGa2O4-ZnO System," Journal of Solid State Chemistry, Apr. 1, 1995, vol. 116, No. 1, pp. 170-178.
Kitzerow, H et al., "Observation of Blue Phases in Chiral Networks," Liquid Crystals, 1993, vol. 14, No. 3, pp. 911-916.
Kurokawa, Y et al., "UHF RFCPUS on Flexible and Glass Substrates for Secure RFID Systems," Journal of Solid-State Circuits , 2008, vol. 43, No. 1, pp. 292-299.
Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.
Lee, H et al., "Current Status of, Challenges to, and Perspective View of AM-OLED," IDW '06 : Proceedings of the 13th International Display Workshops, Dec. 7, 2006, pp. 663-666.

(56) References Cited

OTHER PUBLICATIONS

Lee, J et al., "World'S Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium-Oxide-Based Thin-Film Transistors by DC Sputtering," SID Digest '09 : SID International Symposium Digest of Technical Papers, May 31, 2009, pp. 191-193.

Li., C et al. "Modulated Structures of Homologous Compounds $InMO_3(ZnO)_m$ (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "Suftla Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the $In_2O_3$-$Ga_2ZnO_4$-ZnO system at 1350° C.," Journal of Solid State Chemistry, Aug. 1, 1991, vol. 93, No. 2, pp. 298-315.

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.

Nomura, K et al., "Carrier transport in transparent oxide semiconductor with intrinsic structural randomness probed using single-crystalline $InGaO_3(ZnO)_5$ films," Appl. Phys. Lett. (Applied Physics Letters) , Sep. 13, 2004, vol. 85, No. 11, pp. 1993-1995.

Nowatari, H et al., "60.2: Intermediate Connector With Suppressed Voltage Loss for White Tandem OLEDS," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using In-Ga-Zn-Oxide TFTS With a Novel Passivation Layer," SID Digest '09 : SID International Symposium Digest of Technical Papers, May 31, 2009, pp. 284-287.

Ohara, H et al., "Amorphous In-Ga-Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide $InGaO_3(ZnO)_m$ (m<4):a Zn4s conductor," Philosophical Magazine, 2001, vol. 81, No. 5, pp. 501-515.

Orita, M et al., "Mechanism of Electrical Conductivity of Transparent $InGaZnO_4$," Phys. Rev. B (Physical Review. B), Jan. 15, 2000, vol. 61, No. 3, pp. 1811-1816.

Osada, T et al., "15.2: Development of Driver-Integrated Panel using Amorphous In-Ga-Zn-Oxide TFT," SID Digest '09 : SID International Symposium Digest of Technical Papers, May 31, 2009, pp. 184-187.

Osada, T et al., "Development of Driver-Integrated Panel Using Amorphous In-Ga-Zn-Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park. J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium-Gallium-Zinc Oxide TFTS and Their Application for Large Size AMOLED." AM-FPD '08 Digest of Technical Papers, Jul. 2, 2008, pp. 275-278.

Park, S et al., "Challenge to Future Displays: Transparent AM-OLED Driven by Peald Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In-Ga-Zn-Oxide TFTS," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO ($Ga_2O_3$-$In_2O_3$-ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on $SrTiO_3$ With Sputtered $Al_2O_3$ Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

\* cited by examiner

FIG. 4

| | | Data writing in k-th row<br>k-th row and 1st column is "1"<br>k-th row and 2nd to n-th column is "0" | Data reading in k-th row<br>k-th row and 1st column is "1"<br>k-th row and 2nd to n-th column is "0" |
|---|---|---|---|
| S_1~S_k | V3<br>0V | ⎍ | |
| S_(k+1)~S_m | V3<br>0V | | |
| BL_1 | V2<br>V4<br>0V | ⎍ | Vdd<br>0V |
| BL_2~BL_n | V2<br>V4<br>0V | ⎍ | Vdd<br>0V |
| WL_1~WL_(k-1) | V5<br>0V | | ⎍ |
| WL_k | V5<br>0V | | |
| WL_(k+1)~WL_m | V5<br>0V | | ⎍ |
| G_1 | V1<br>0V | | ⎍ |
| G_2 | V1<br>0V | ⎍ | ⎍ |

FIG. 5

| | | Data writing in k-th row<br>k-th row and 1st column is "1"<br>k-th row and 2nd to n-th column is "0" | Data reading in k-th row<br>k-th row and 1st column is "1"<br>k-th row and 2nd to n-th column is "0" |
|---|---|---|---|
| S_1~S_k | V3<br>0V | ⎍ | |
| S_(k+1)<br>~S_m | V3<br>0V | | |
| BL_1 | V2<br>V4<br>0V | ⎍ | Vdd<br>0V |
| BL_2~BL_n | V2<br>V4<br>0V | ⎍ | Vdd<br>0V |
| WL_1<br>~WL_(k-1) | V5<br>0V | | ⎍ |
| WL_k | V5<br>0V | | |
| WL_(k+1)<br>~WL_m | V5<br>0V | | ⎍ |
| G | V1<br>0V | | ⎍ |

SEMICONDUCTOR MEMORY DEVICE WITH LONG DATA HOLDING PERIOD

TECHNICAL FIELD

An embodiment of the invention disclosed herein relates to a semiconductor device including a semiconductor element and a manufacturing method of the semiconductor device.

BACKGROUND ART

Memory devices including semiconductor elements are broadly classified into two categories: volatile memory devices that lose stored data when not powered, and nonvolatile memory devices that hold stored data even when not powered.

A typical example of volatile memory devices is a dynamic random access memory (DRAM). A DRAM stores data in such a manner that a transistor included in a storage element is selected and electric charge is stored in a capacitor.

When data is read from a DRAM, electric charge in a capacitor is lost according to the above-described principle; thus, another write operation is necessary every time data is read out. Moreover, a transistor included in a memory element has leakage current (off-state current) between a source and a drain in an off state or the like and electric charge flows into or out of the transistor even if the transistor is not selected, which makes a data holding period short. For that reason, write operation (refresh operation) is necessary at predetermined intervals, and it is difficult to sufficiently reduce power consumption. Furthermore, since stored data is lost when power supply stops, another memory device utilizing a magnetic material or an optical material is needed in order to hold the data for a long time.

Another example of volatile memory devices is a static random access memory (SRAM). An SRAM holds stored data by using a circuit such as a flip-flop and thus does not need refresh operation, which is an advantage over a DRAM. However, cost per storage capacity is high because a circuit such as a flip-flop is used. Moreover, as in a DRAM, stored data in an SRAM is lost when power supply stops.

A typical example of nonvolatile memory devices is a flash memory. A flash memory includes a floating gate between a gate electrode and a channel formation region in a transistor and stores data by holding charge in the floating gate. Therefore, a flash memory has advantages in that the data holding period is extremely long (semi-permanent) and refresh operation which is necessary to volatile memory devices is not needed (e.g., see Patent Document 1).

However, in a flash memory, there is a problem in that a memory element becomes unable to function after a predetermined number of writing operations because a gate insulating layer included in the memory element deteriorates due to tunneling current generated in writing operations. In order to reduce effects of this problem, a method in which the number of writing operations is equalized among memory elements can be employed, for example, but a complex peripheral circuit is needed to realize this method. Moreover, even when such a method is employed, the fundamental problem of lifetime cannot be resolved. In other words, a flash memory is not suitable for applications in which data is frequently rewritten.

In addition, high voltage is necessary in order to inject charge into the floating gate or removing the charge, and a circuit for that purpose is required. Further, it takes a relatively long time to inject or remove electric charge, and it is not easy to increase the speed of writing or erasing data.

REFERENCE

[Patent Document 1] Japanese Published Patent Application No. S57-105889

In view of the foregoing problems, an object of one embodiment of the disclosed invention is to provide a semiconductor device having a novel structure, which can hold stored data even when not powered and which has an unlimited number of write cycles.

An embodiment of the disclosed invention is a semiconductor device capable of holding data with a transistor whose off-state current is sufficiently small. In the semiconductor device, a source terminal (or a drain terminal) of the transistor is supplied with a potential higher than that of a gate terminal during a data holding period. More specifically, the following structures can be employed, for example.

DISCLOSURE OF INVENTION

In one embodiment of the disclosed invention, a semiconductor device includes a source line, a bit line, and first to m-th (m is a natural number) memory cells connected in series between the source line and the bit line. Each of the first to m-th memory cells includes a first transistor having a first gate terminal, a first source terminal, and a first drain terminal, a second transistor having a second gate terminal, a second source terminal, and a second drain terminal, and a capacitor. A second source terminal of a k-th (k is a natural number greater than or equal to 1 and less than or equal to m) memory cell is connected to a second drain terminal of a memory cell adjacent to the k-th memory cell, or a second drain terminal of the k-th memory cell is connected to a second source terminal of a memory cell adjacent to the k-th memory cell. A first gate terminal of the k-th memory cell, the second source terminal (or drain terminal) of the k-th memory cell, and one of terminals of a capacitor of the k-th memory cell are electrically connected to each other and form a node of the k-th memory cell. The node of the k-th memory cell is supplied with a potential higher than that of the second gate terminal of the k-th memory cell in a data holding period in which the second gate terminal is supplied with a potential at which the second transistor is turned off.

Here, the first transistor and the second transistor may include semiconductor regions containing different semiconductor materials as their respective main components. The second transistor may include a semiconductor region containing a metal oxide as its main component. Note that a "semiconductor containing a metal oxide as its main component" may be referred to as an "oxide semiconductor" in the following description.

In the above-mentioned data holding period, the node of the memory cell adjacent to the k-th memory cell may be supplied with a potential higher than that of the second gate terminal of the memory cell adjacent to the k-th memory cell. In the data holding period, the second gate terminal of the k-th memory cell may be supplied with a ground potential. In the data holding period, the node of the k-th memory cell may be supplied with a positive potential. In the data holding period, the second gate terminal of the k-th memory cell and the node of the k-th memory cell may be supplied with a potential at which the amount of current flowing in the second transistor of the k-th memory cell is 1 zA or less.

In the above embodiment, the first memory cell or the m-th memory cell may be used as a dummy cell. The capacitance of the capacitor included in the first memory cell or the m-th memory cell may be larger than the capacitance of the capacitor included in any of the second to (m−1)-th memory cells. The channel length of the second transistor included in the first memory cell or the m-th memory cell may be longer than the channel length of the second transistor included in any of the second to (m−1)-th memory cells.

In the above embodiment, a first source terminal of the k-th (k is a natural number greater than or equal to 1 and less than or equal to m) memory cell may be connected to a first drain terminal of the memory cell adjacent to the k-th memory cell, or a first drain terminal of the k-th memory cell may be connected to a first source terminal of the memory cell adjacent to the k-th memory cell.

Note that in the above embodiment, the transistor may be formed using a material containing a metal oxide as its main component; the disclosed invention is not limited thereto. A material capable of realizing off-state current characteristics comparable to those of a metal oxide, for example, a widegap material (specifically, a semiconductor material having an energy gap Eg of more than 3 eV, for example), such as silicon carbide, or the like may be employed.

In the above description, the term "adjacent" refers to the relationship between memory cells connected in series. That is, the expression "adjacent" is not used for the relationship between memory cells that are not connected in series even if the memory cells are most adjacent to each other.

In addition, the term "main component" used in this specification and the like refers to a component whose content is the highest (at. %). According to this statement, for example, it can be said that the main component of a "silicon wafer" is silicon, and the main component of a "silicon carbide substrate" is silicon carbide.

The term "dummy cell" is used to refer to a memory cell which is not intended to hold data, or a similar component. A function of a "dummy cell" is to extend the data holding period of the adjacent memory cells, for example.

Note that the term "over" or "below" in this specification and the like does not necessarily mean that a component is placed "directly on" or "directly under" another component. For example, the expression "a gate electrode over a gate insulating layer" does not exclude a structure where a component is placed between the gate insulating layer and the gate electrode.

In addition, the term "electrode" or "wiring" in this specification and the like does not limit a function of a component. For example, an "electrode" can be used as part of a "wiring", and the "wiring" can be used as part of the "electrode". Furthermore, the term "electrode" or "wiring" can include the case where a plurality of "electrodes" or "wirings" is formed in an integrated manner. Note that some element structures do not include apparent "electrodes" (for example, some elements function as transistors but do not have a component which can be regarded as an electrode). In order to include such a structure, the term "terminal" may be used instead of the term "electrode" from a circuit standpoint. Note that a "terminal" is often identical to an "electrode" or a "wiring"; thus, these terms can be used interchangeably.

Functions of a "source" and a "drain" in a transistor are sometimes interchanged with each other when a transistor of opposite polarity is used or when the direction of current flowing is changed in circuit operation, for example. Therefore, the terms "source" and "drain" can be used to denote the drain and the source, respectively, in this specification and the like.

Note that the term "electrically connected" in this specification and the like includes the case where components are connected through an "object having any electric function". There is no particular limitation on an object having any electric function as long as electric signals can be transmitted and received between components that are connected through the object. Examples of an "object having any electric function" are a switching element such as a transistor, a resistor, an inductor, a capacitor, and an element with a variety of functions as well as an electrode and a wiring.

In a semiconductor device according to an embodiment of the disclosed invention, a source terminal (or a drain terminal) of a transistor is supplied with a potential higher than that of a gate terminal thereof in a data holding period. This enables data to be held for a very long time. In particular, a semiconductor device including a transistor having a semiconductor region containing a metal oxide as its main component can hold data for so long a time that the semiconductor device can be substantially used as a nonvolatile memory device.

BRIEF DESCRIPTION OF DRAWINGS

FIG. 2 is a circuit diagram of a semiconductor device.
FIG. 4 is a timing chart.
FIG. 5 is a timing chart.

BEST MODE FOR CARRYING OUT THE INVENTION

Figures 1, 1A:
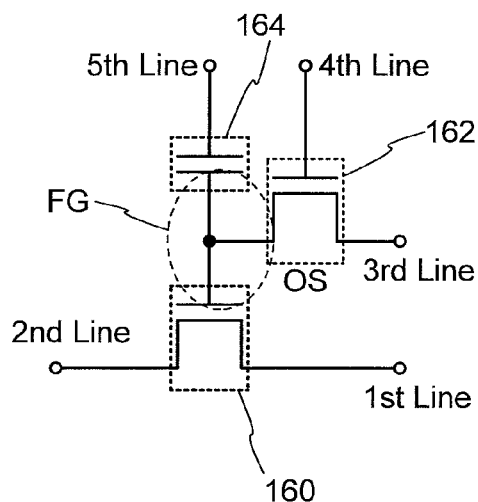
FIGS. 1A-1, 1A-2, and 1B are circuit diagrams of a semiconductor device.

Examples of embodiments of the disclosed invention will be described below with reference to the drawings. Note that the present invention is not limited to the following description and it will be readily appreciated by those skilled in the art that the modes and details of the present invention can be modified in various ways without departing from the spirit and scope thereof. Therefore, the present invention should not be interpreted as being limited to the description in the following embodiments.

Note that the position, size, range, or the like of each component illustrated in drawings and the like is not accurately represented in some cases for easy understanding. Therefore, the disclosed invention is not necessarily limited to the position, size, range, or the like as disclosed in the drawings and the like.

Note that ordinal numbers such as "first", "second", and "third" in this specification and the like are used in order to avoid confusion among components, and the terms do not limit the components numerically.

Embodiment 1

In this embodiment, a circuit configuration and an operation of a semiconductor device according to one embodiment of the disclosed invention will be described with reference to FIGS. 1A-1, 1A-2, and 1B and FIGS. 2 to 5. Note that in some circuit diagrams, "OS" is written beside a transistor in order to indicate that the transistor includes an oxide semiconductor (OS).

<Basic Circuit>

First, a basic circuit configuration and an operation thereof will be described with reference to FIGS. 1A-1, 1A-2, and 1B. In a semiconductor device illustrated in FIG. 1A-1, a first wiring (1st Line) is electrically connected to a source terminal (or a drain terminal) of a transistor 160. A second wiring (2nd Line) is electrically connected to a drain terminal (or a source terminal) of the transistor 160. A third wiring (3rd Line) is electrically connected to a drain terminal (or a source terminal) of a transistor 162. A fourth wiring (4th Line) is electrically connected to a gate terminal of the transistor 162. A gate terminal of the transistor 160 and a source terminal (or a drain terminal) of the transistor 162 are electrically connected to one terminal of a capacitor 164. A fifth wiring (5th Line) is electrically connected to the other terminal of the capacitor 164.

Here, as the transistor 162, a transistor including an oxide semiconductor can be used, for example. A transistor including an oxide semiconductor has a characteristic of a significantly small off-state current. For that reason, a potential of the gate terminal of the transistor 160 can be held for an extremely long period by turning off the transistor 162. By providing the capacitor 164, holding of charge applied to the gate terminal of the transistor 160 and reading of data held can be performed more easily.

Note that there is no particular limitation on the transistor 160. In terms of increasing the speed of reading data, it is preferable to use a transistor with high switching speed such as a transistor formed using single crystal silicon, for example.

Figure 1B:
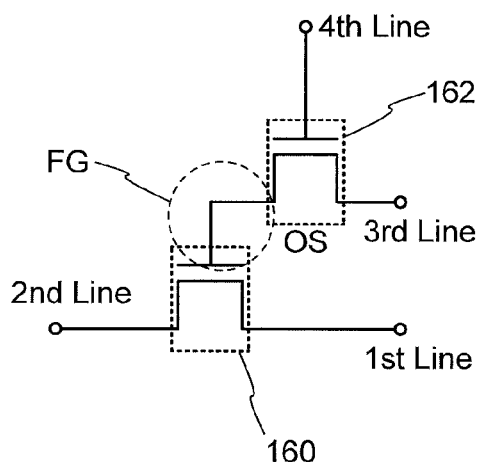

Alternatively, a structure in which the capacitor 164 is not provided is also possible as illustrated in FIG. 1B.

The semiconductor device in FIG. 1A-1 utilizes a characteristic in which the potential of the gate terminal of the transistor 160 can be held, and can thus write, hold, and read data as follows.

First of all, writing and holding of data will be described. First, the potential of the fourth wiring is set to a potential at which the transistor 162 is turned on, so that the transistor 162 is turned on. Accordingly, the potential of the third wiring is supplied to the gate terminal of the transistor 160 and to the capacitor 164. That is, predetermined charge is supplied to the gate terminal of the transistor 160 (writing). Here, one of two kinds of charges providing different potentials (hereinafter, a charge providing a low potential is referred to as charge $Q_L$ and a charge providing a high potential is referred to as charge $Q_H$) is applied. Note that three or more kinds of charges providing different potentials may be applied to improve storage capacity. After that, the potential of the fourth wiring is set to a potential at which the transistor 162 is turned off, so that the transistor 162 is turned off. Thus, the charge supplied to the gate terminal of the transistor 160 is held (holding).

Since the off-state current of the transistor 162 is significantly small, the charge of the gate terminal of the transistor 160 is held for a long time. In this specification and the like, a period when a potential at which the transistor 162 is turned off is supplied to the fourth wiring (i.e., the gate terminal of the transistor 162) and data can be held may be referred to as a "data holding period".

Note that even when the potential of the fourth wiring is set to a potential at which the transistor 162 is turned off, a slight amount of current may flow between the source and the drain of the transistor 162 in the case where a voltage applied between the gate and the source (or the drain) of the transistor 162 based on the potential of the fourth wiring is equal to or substantially equal to the threshold voltage of the transistor 162. This phenomenon is difficult to avoid due to the operation principle of transistors. Therefore, the relationship among potentials at which the off-state current of the transistor 162 is sufficiently small is preferably achieved in a data holding period. For example, in the case where the transistor 162 is an n-channel transistor, a sufficiently high potential relative to that of the gate terminal of the transistor 162 is supplied to the gate terminal of the transistor 160 (i.e., the source terminal of the transistor 162). Alternatively, for example, a positive potential is supplied to the gate terminal of the transistor 160, and a ground potential is supplied to the gate terminal of the transistor 162. Note that the term "sufficiently high potential" given above can be, for example, a potential at which the amount of current flowing in the transistor 162 is 1 zA or less.

Next, reading of data will be described. By supplying an appropriate potential (a reading potential) to the fifth wiring while supplying a predetermined potential (a constant potential) to the first wiring, the potential of the second wiring varies depending on the amount of charge held at the gate terminal of the transistor 160. This is because in general, when the transistor 160 is an n-channel transistor, an apparent threshold voltage $V_{th\_H}$ in the case where $Q_H$ is given to the gate terminal of the transistor 160 is lower than an apparent threshold voltage $V_{th\_L}$, in the case where $Q_L$ is given to the gate terminal of the transistor 160. Here, an apparent threshold voltage refers to the potential of the fifth wiring, which is needed to turn on the transistor 160. Thus, the potential of the fifth wiring is set to a potential $V_0$ intermediate between $V_{th\_H}$ and $V_{th\_L}$, whereby charge supplied to the gate terminal of the transistor 160 can be determined. For example, in the case where $Q_H$ is supplied in writing, when the potential of the fifth wiring is $V_0(>V_{th\_H})$, the transistor 160 is turned on. In the case where $Q_L$, is supplied in writing, even when the potential of the fifth wiring is $V_0(<V_{th\_L})$, the transistor 160 remains off. Therefore, the data held can be read by measuring the potential of the second wiring.

Note that in the case where memory cells are arrayed to be used, it is necessary that data of only a desired memory cell can be read. In order to read data of a predetermined memory cell and not to read data of the other memory cells, in the case where the transistors 160 are connected in parallel between memory cells, fifth wirings in memory cells that are not a target for reading are supplied with a potential at which the transistors 160 are turned off regardless of the state of the gate electrodes, that is, a potential lower than $V_{th\_H}$. On the other hand, in the case where the transistors 160 are connected in series between memory cells, fifth wirings in memory cells that are not a target for reading are supplied with a potential at which the transistors 160 are turned on regardless of the state of the gate electrodes, that is, a potential higher than $V_{th\_L}$.

Next, rewriting of data will be described. Rewriting of data is performed in a manner similar to that of the writing and holding of data. That is, the potential of the fourth wiring is set to a potential at which the transistor 162 is turned on, so that the transistor 162 is turned on. Accordingly, the potential of the third wiring (a potential for new data) is supplied to the gate terminal of the transistor 160 and to the capacitor 164. After that, the potential of the fourth wiring is set to a potential at which the transistor 162 is turned off, so that the transistor 162 is turned off. Accordingly, the gate terminal of the transistor 160 is supplied with charge for new data.

In the semiconductor device according to an embodiment of the disclosed invention, data can be directly rewritten by another data writing operation as described above. Therefore, extraction of charge from a floating gate with the use of a high voltage which is necessary for a flash memory or the like is not needed, and thus a decrease in operation speed due to erasing operation can be suppressed. In other words, high-speed operation of the semiconductor device can be realized.

Note that the source terminal (or the drain terminal) of the transistor 162 is electrically connected to the gate terminal of the transistor 160 and therefore has a function similar to that of a floating gate of a floating gate transistor used for a nonvolatile memory element. A portion where the source terminal (or the drain terminal) of the transistor 162 and the gate terminal of the transistor 160 are electrically connected to each other is called a node FG in some cases. When the transistor 162 is turned off, the node FG can be regarded as being embedded in an insulator and thus charge is held at the node FG. The off-state current of the transistor 162 including an oxide semiconductor is smaller than or equal to 1/100000 of the off-state current of a transistor including a silicon semiconductor; thus, loss of the charge accumulated in the node FG due to leakage in the transistor 162 is negligible. That is, with the transistor 162 including an oxide semiconductor, a nonvolatile memory device which can hold data without being supplied with power can be realized.

For example, when the off-state current of the transistor 162 at room temperature (25° C.) is 10 zA (1 zA (zeptoampere) is $1 \times 10^{-21}$ A) or less and the capacitance of the capacitor 164 is approximately 10 fF, data can be held for $10^4$ seconds or longer. It is needless to say that the holding time depends on transistor characteristics and capacitance.

Further, the semiconductor device according to an embodiment of the disclosed invention does not have the problem of deterioration of a gate insulating film (a tunnel insulating film), which is a problem of a conventional floating gate transistor. That is, the problem of deterioration of a gate insulating film due to injection of electrons into a floating gate, which is a conventional problem, can be solved. This means that there is no limit on the number of write cycles in principle. Furthermore, a high voltage needed for writing or erasing in a conventional floating gate transistor is not necessary.

Figures 1, 1A, 2:
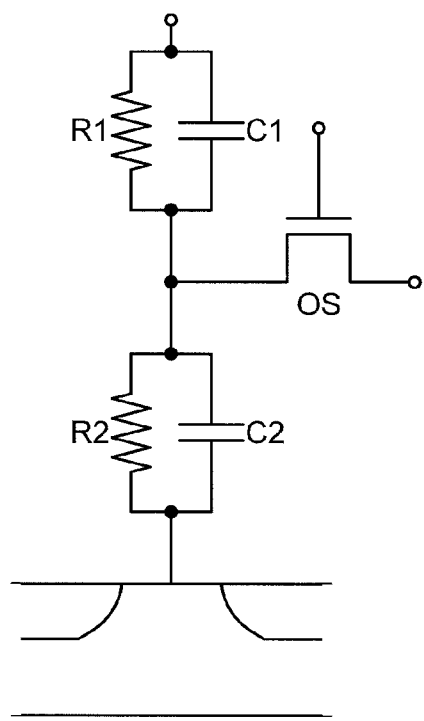
Figure 2:
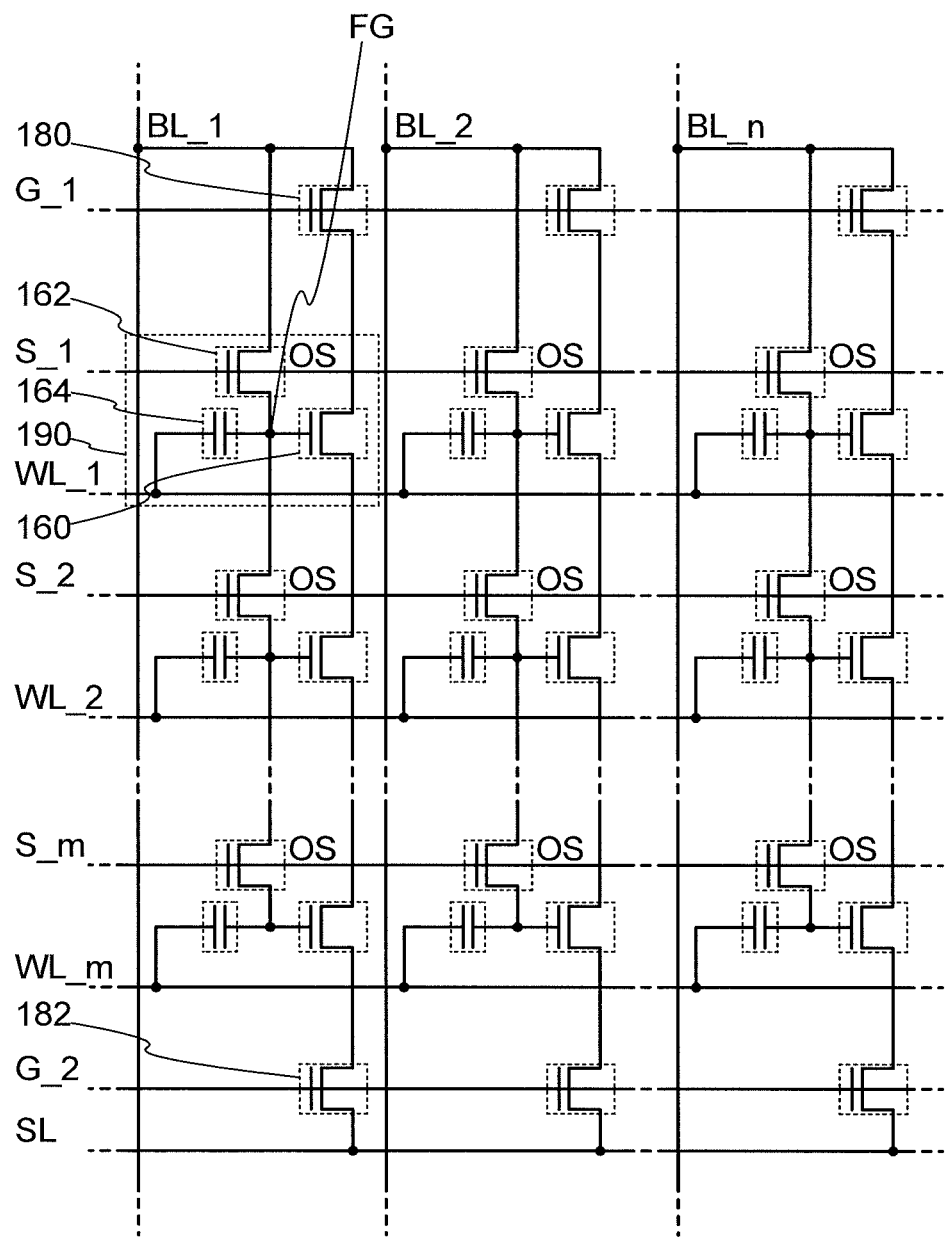

Components such as transistors in the semiconductor device in FIG. 1A-1 can be regarded as including resistors and capacitors as illustrated in FIG. 1A-2. That is, in FIG. 1A-2, the transistor 160 and the capacitor 164 are each regarded as including a resistor and a capacitor. R1 and C1 denote the resistance and the capacitance of the capacitor 164, respectively. The resistance R1 corresponds to the resistance of the insulating layer included in the capacitor 164. R2 and C2 denote the resistance and the capacitance of the transistor 160, respectively. The resistance R2 corresponds to the resistance of the gate insulating layer at the time when the transistor 160 is turned on. The capacitance C2 corresponds to a so-called gate capacitance (capacitance formed between the gate electrode and the source or drain electrode, and capacitance formed between the gate electrode and the channel formation region).

A charge holding period (also referred to as a data holding period) is determined mainly by the off-state current of the transistor 162 under the conditions where the gate leakage current of the transistor 162 is sufficiently small and R1 and R2 satisfy R1≥ROS (R1 is greater than or equal to ROS) and R2≥ROS (R2 is greater than or equal to ROS), where ROS is the resistance (also referred to as effective resistance) between the source electrode and the drain electrode in a state where the transistor 162 is turned off.

On the other hand, in the case where the above conditions are not satisfied, it is difficult to secure a sufficient holding period even if the off-state current of the transistor 162 is sufficiently small. This is because a leakage current other than the off-state current of the transistor 162 (e.g., a leakage current generated between the source terminal and the gate terminal of the transistor 160) is large. Accordingly, it can be said that it is preferable that the semiconductor device disclosed in this embodiment satisfies the relationships of R1≥ROS (R1 is greater than or equal to ROS) and R2≥ROS (R2 is greater than or equal to ROS).

Meanwhile, it is desirable that C1 and C2 satisfy C1 C2 (C1 is greater than or equal to C2). This is because if C1 is large, when the potential of the node FG is controlled by the fifth wiring, the potential of the fifth wiring can be efficiently supplied to the node FG and the difference between potentials supplied to the fifth wiring (e.g., a reading potential and a non-reading potential) can be kept small.

When the above relationships are satisfied, a more favorable semiconductor device can be realized. Note that R1 and R2 depend on the gate insulating layer of the transistor 160 and the insulating layer of the capacitor 164. The same applies to C1 and C2. Therefore, the material, the thickness, and the like of the gate insulating layer are preferably set as appropriate to satisfy the above relationships.

In the semiconductor device described in this embodiment, the node FG has a function similar to that of a floating gate of a floating gate transistor of a flash memory or the like, but the node FG of this embodiment has a feature which is essentially different from that of the floating gate of the flash memory or the like.

In the case of a flash memory, since a high potential is applied to a control gate, it is necessary to keep a proper distance between cells in order to prevent the potential of the control gate from affecting a floating gate of an adjacent cell. This is one factor inhibiting higher integration of the semiconductor device. The factor is attributed to a basic principle of a flash memory, in which a tunneling current is generated by applying a high electric field.

On the other hand, the semiconductor device according to this embodiment is operated by switching of a transistor including an oxide semiconductor and does not use the above-described principle of charge injection by a tunneling current. That is, a high electric field for charge injection is not necessary, unlike a flash memory. Accordingly, it is not necessary to consider an influence of a high electric field from a control gate on an adjacent cell, and this facilitates an increase in the degree of integration.

In addition, the semiconductor device according to this embodiment is advantageous over a flash memory also in that a high electric field is not necessary and a large peripheral circuit (such as a step-up circuit) is not necessary. For example, the highest voltage applied to the memory cell according to this embodiment (the difference between the highest potential and the lowest potential applied to respective terminals of the memory cell at the same time) can be 5 V or less, preferably 3 V or less, in each memory cell in the case where data of two stages (one bit) is written.

In the case where the relative permittivity $\in r1$ of the insulating layer included in the capacitor 164 is different from the relative permittivity $\in r2$ of the insulating layer included in the transistor 160, it is easy to satisfy C1≥C2 (C1 is greater than or equal to C2) while satisfying 2·S2≥S1 (2·S2 is greater than or equal to S1), preferably S2≥S1 (S2 is greater than or equal to S1), where S1 is the area of the insulating layer included in the capacitor 164 and S2 is the area of the insulating layer forming a gate capacitor of the transistor 160. In other words, C1 can easily be made greater than or equal to C2 while the area of the insulating layer included in the capacitor 164 is made small. Specifically, for example, a film including a high-k material such as hafnium oxide or a stack of a film including a high-k material such as hafnium oxide and a film including an oxide semiconductor is used for the insulating layer included in the capacitor 164 so that ∈r1 can be set to 10 or more, preferably 15 or more, and silicon oxide is used for the insulating layer forming the gate capacitor so that 3≤∈r2≤4 (∈r2 is greater than or equal to 3 and less than or equal to 4).

A combination of such structures enables the semiconductor device according to one embodiment of the disclosed invention to have further higher integration.

Note that in addition to the increase in the degree of integration, a multilevel technique can be employed to increase the storage capacity of the semiconductor device. For example, three or more levels of data are written to one memory cell, whereby the storage capacity can be increased as compared to the case where two-level (one-bit) data is written. The multilevel technique can be achieved by, for example, supplying charge Q providing a potential to the gate terminal of the transistor 160, in addition to charge $Q_L$ providing a low potential and charge $Q_H$ providing a high potential as described above.

Application Example

Next, a more specific circuit configuration to which the circuit illustrated in FIGS. 1A-1, 1A-2, and 1B is applied and an operation thereof will be described with reference to FIGS. 2 to 5.

FIG. 2 is an example of a circuit diagram of a semiconductor device including m (rows)(in a vertical direction)×n (columns)(in a horizontal direction) memory cells 190. The configuration of the memory cells 190 in FIG. 2 is similar to that in FIG. 1A-1. That is, the first wiring and the third wiring in FIG. 1A-1 correspond to a bit line BL in FIG. 2; the second wiring in FIG. 1A-1, a source line SL in FIG. 2; the fourth wiring in FIG. 1A-1, a signal line S in FIG. 2; and the fifth wiring in FIG. 1A-1, a word line WL in FIG. 2. Note that FIG. 2 shows a configuration in which a plurality of transistor 162 is connected in series in a column direction, a plurality of transistors 160 is connected in series in the column direction, and thus a plurality of memory cells 190 is connected in series. Only the memory cell 190 in the first row is connected to the bit line BL not through other memory cells 190, and only the memory cell 190 in the m-th row is connected to the source line SL not through other memory cells 190. In other words, the memory cells 190 in the other rows are electrically connected to the bit line BL and the source line SL through other memory cells 190 of the same column.

The semiconductor device illustrated in FIG. 2 includes m (m is an integer greater than or equal to 2) word lines WL; m signal lines S; n (n is an integer greater than or equal to 2) bit lines BL; a memory cell array having the memory cells 190 in a matrix of in (rows)(in the vertical direction)×n (columns)(in the horizontal direction); a source line SL; a selection line G_1 and a selection line G_2; n selection transistors 180 which are arranged along the selection line G_1 and between the bit lines BL and the memory cells 190 in the first row and whose gate terminals are electrically connected to the selection line G_1; and n selection transistors 182 which are arranged along the selection line G_2 and between the memory cells 190 in the m-th row and the source line SL and whose gate terminals are electrically connected to the selection line G_2.

That is, the bit lines BL are electrically connected to the drain terminals (or the source terminals) of the transistors 162 of the memory cells 190 in the first row, and are electrically connected to the source terminals (or the drain terminals) of the transistors 160 of the memory cells 190 in the first row through the selection transistors 180. The source line SL is electrically connected to the drain terminals (or the source terminals) of the transistors 160 of the memory cells 190 in the m-th row through the selection transistors 182. The signal line S in the k-th row (k is a natural number greater than or equal to 1 and less than or equal to in) is electrically connected to the gate terminals of the transistors 162 of the memory cells 190 in the k-th row. The word line WL in the k-th row is electrically connected to one terminal of each of the capacitors 164 of the memory cells 190 in the k-th row.

The source terminals (or the drain terminals) of the transistors 160 of the memory cells 190 in the l-th row (l is a natural number greater than or equal to 2 and less than or equal to m) are electrically connected to the drain terminals (or the source terminals) of the transistors 160 of the memory cells 190 in the (l−1)-th row.

The drain terminals (or the source terminals) of the transistors 162 of the memory cells 190 in the l-th row are electrically connected to the gate terminals of the transistors 160, the source terminals (or the drain terminals) of the transistors 162, and the other terminal of each of the capacitors 164 of the memory cells 190 in the (l−1)-th row.

In other words, the source terminals of the transistors 162 of the memory cells 190 in the k-th row are connected to the drain terminals of the transistors 162 of the adjacent memory cells 190, and the drain terminals thereof are connected to the source terminals of the transistors 162 of the adjacent memory cells 190.

In addition, in the memory cells 190 in the k-th row, the gate terminals of the transistors 160, the source terminals (or the drain terminals) of the transistors 162, and the other terminals of the capacitors 164 are electrically connected and form nodes FG of the memory cells in the k-th row. That is, in the semiconductor device illustrated in FIG. 2, the nodes FG in the memory cells 190 in the (l−1)-th row each have the structure in FIG. 1A-1, and are also electrically connected to the drain terminals of the transistors 162 in the memory cell 190 in the l-th row. Here, the transistor 162 including an oxide semiconductor in each of the memory cells in the l-th row and each of the memory cells in the (l−1)-th row has significantly small off-state current; thus, in the semiconductor device illustrated in FIG. 2, the potential of the node FG can be held for a long time by turning off the transistor 162 as in the semiconductor device illustrated in FIG. 1A-1.

In the case where the transistors 162 of the memory cells 190 are connected in series as described above, the transistors 162 of the adjacent memory cells can share a source electrode or a drain electrode; thus, it is easier to decrease the area occupied by the memory cell 190 as compared to the case where the transistors 162 of the memory cells 190 are connected in parallel. For example, given that the minimum feature size is F, the area occupied by the memory cell 190 can be approximately 4 $F^2$ to 12 $F^2$. Accordingly, the degree of integration of the semiconductor device can be increased, and the storage capacity per unit area can be increased.

Figure 3:
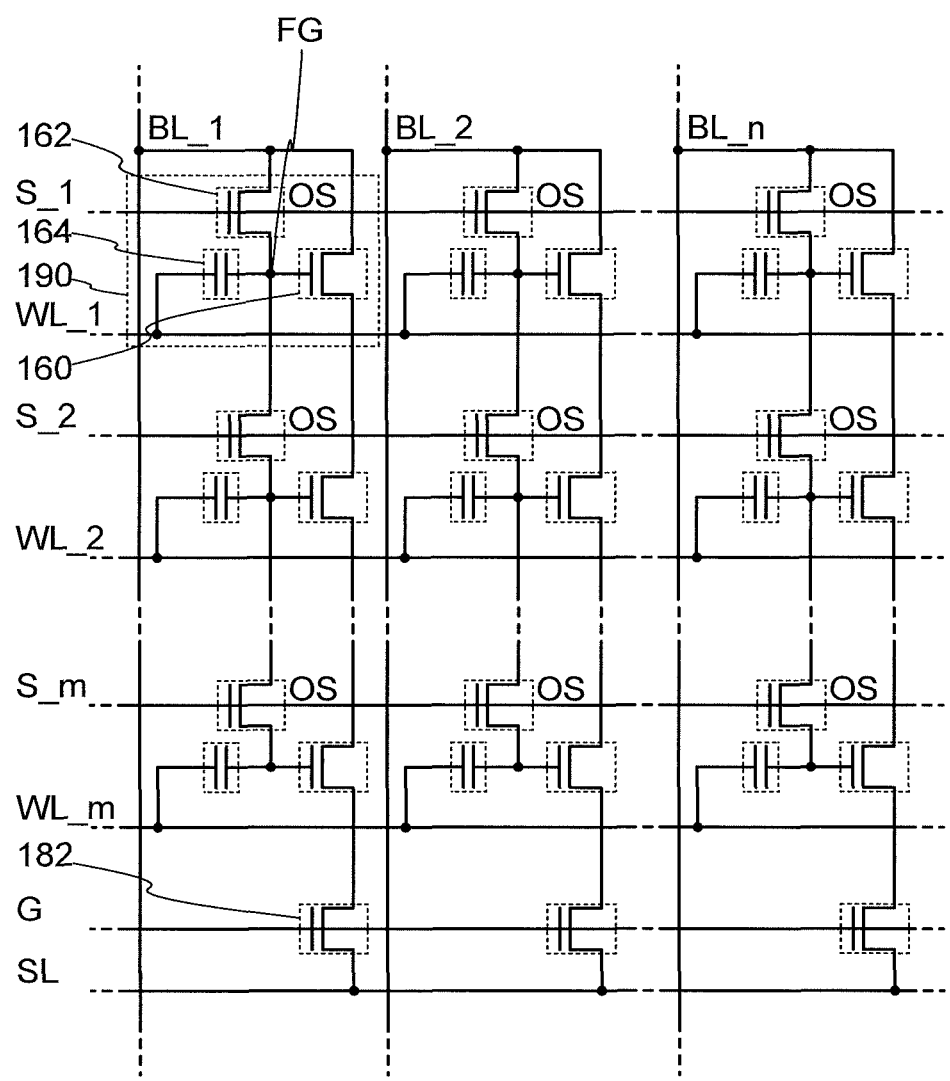
FIG. 3 is a circuit diagram of a semiconductor device.

Note that the selection line G_1, the selection line G_2, the selection transistors 180, and the selection transistors 182 are not necessarily provided. The selection line G1 and the selection transistors 180 may be omitted. Alternatively, the selection line G_2 and the transistors 182 may be omitted. For example, as illustrated in FIG. 3, a structure which includes only a selection line G corresponding to the selection line G_2 and the selection transistors 182 may be employed.

Data writing, holding, and reading are basically similar to those in the case of FIGS. 1A-1, 1A-2, and 1B. Note that data writing is performed on a row basis, and is performed sequentially from row to row, from the memory cells which are far from the bit lines BL. This is because the node FG of one of the memory cells 190 is connected to the node FG of the adjacent memory cell 190 through the transistor 162, and it is difficult to perform writing operation of each of the memory cells 190.

A specific writing operation is as described below. Note that although the case where either a potential V2 (a potential higher than a potential GND (0 V)) or a potential V4 (a potential higher than the potential GND (0 V) and lower than the potential V2) is supplied to the node FG is described here as an example, the relationship among potentials supplied to the node FG is not limited to this example. Data that is held when the potential V2 is supplied to the node FG is referred to as data "1", and data that is held when the potential V4 is supplied to the node FG is referred to as data "0".

First, the potential of the selection line G1 is set to GND (0 V), the potential of the selection line G_2 is set to V1 (e.g., VDD), and the potential of the signal line S connected to the memory cells 190 to which data is to be written is set to V3 (a potential higher than V2) so that the memory cells 190 are selected. Note that in the case where other memory cells 190 are present between the memory cells 190 to which data is to be written and the bit lines BL, the potential of the signal line S which is connected to the other memory cells 190 is set to V3; thus, the potential of the bit lines BL can be supplied to the memory cells 190 to which data is to be written.

In the case of writing data "0" to the memory cells 190, the potential V4 is supplied to the bit lines BL, and in the case of writing data "1" to the memory cells 190, the potential V2 is supplied to the bit lines BL. Because the potential of the signal line S is V3 here, V2 or V4 can be supplied to the nodes FG.

Data is held by setting the potential of the signal line S connected to the memory cells 190 in which data is to be held to GND. When the potential of the signal line S is fixed to GND, the potential of the nodes FG is fixed to the potential at the time of writing. In other words, when V2 for data "1" is supplied to the nodes FG the potential of the nodes FG is V2, and when V4 for data "0" is supplied to the nodes FG the potential of the nodes FG is V4.

Because GND is supplied to the signal line S, the transistors 162 are turned off regardless of whether data "1" or data "0" is written. Since the off-state current of the transistor 162 is significantly small, the charge of the gate terminal of the transistor 160 is held for a long time. Here, regardless of whether data "1" or data "0" is to be held, V2 or V4 which is higher than GND (0 V) is used and the signal line S is supplied with GND. Thus, the source terminal of the transistor 162 is supplied with a potential higher than that of the gate terminal, and moreover, the off-state current can be reduced. For example, when GND is used as a potential of the node FG in order to hold data "0", there may be a case where the off-state current of the transistor 162 cannot be ignored. By employing the above-described relationship among potentials, the problem of a short holding period which arises in the above case can be solved. Note that in that case, the potential V4 is preferably a potential at which the amount of current flowing in the transistor 162 is 1 zA or less when the gate terminal of the transistor 162 is supplied with GND.

In addition, even when a memory is not powered, the signal line S is supplied with the potential GND and the node FG is supplied with V2 or V4 which is a potential higher than GND (0 V); thus, the transistor 162 can be sufficiently turned off and the off-state current can be reduced.

Note that after this operation for holding data, data is written to the adjacent memory cells 190 (which are closer to the bit lines BL). The details are as described above.

Data is read by setting the potential of the word line WL connected to the memory cells 190 from which data is to be read to GND, setting the potentials of the word lines WL connected to the memory cells 190 from which data is not to be read to V5 (e.g., VDD), and setting the potentials of the selection line G_1 and the selection line G_2 to V1.

When the potential of the word line WL connected to the memory cells 190 from which data is to be read is set to GND, the transistors 160 are turned on if V2 for data "1" is supplied to the nodes FG of the memory cells 190 from which data is to be read. On the other hand, the transistors 160 are turned off if V4 for data "0" is supplied to the nodes FG. Note that the potential V4 is set to a potential at which the transistors 160 are turned off.

Note that the word line WL may be supplied with a negative potential when the potential V4 is not a potential at which the transistors 160 are turned off. As a result, the potential of the nodes FG can be made lower than V4 and the transistors 160 can be turned off. If necessary, the signal line S connected to the transistors 162 connected to the nodes FG may be set at a negative potential.

When the potentials of the word lines WL connected to the memory cells 190 from which data is not to be read are set to V5, the transistors 160 are turned on regardless of whether data "1" or data "0" is written in the memory cells 190 from which data is not to be read.

Note that in the configuration illustrated in FIG. 2, data is preferably written sequentially from the memory cells 190 in the row which is farthest from the bit lines BL. This is because the transistors 162 included in the memory cells 190 are connected in series, so that it is difficult to rewrite data in only an arbitrary row. By writing data "0" to the memory cells 190 in the row which is farthest from the bit lines BL, data "0" is also written to memory cells between the bit lines BL and the memory cells 190 in the row which is farthest from the bit lines BL, and data of a block including all these memory cells can be erased at a time.

FIG. 4 is an example of a timing chart for more detailed operations of the semiconductor device in FIG. 2. S, BL, and the like in the timing chart denote the lines to which the potentials in the timing chart are applied. Lines having a similar function are distinguished by "_1", "_2", and the like added to the end of their names.

The timing chart in FIG. 4 shows the relationship among potentials of the lines in the case where data "1" is written to the memory cell in the k-th row and the first column and data "0" is written to the memory cells in the k-th row and the other columns (the second to n-th columns) (data writing in the k-th row) and in the case where data written in the memory cells in the k-th row are read out (data reading in the k-th row). When data are read out, data "1" is stored in the memory cell in the k-th row and the first column and data "0" is stored in the memory cells in the k-th row and the other columns (the second to n-th columns).

When data writing is performed in the k-th row, S_1 to S_k are supplied with the potential V3 so that the transistors 162 in the first to k-th rows are turned on, and S_(k+1) to S_m are supplied with GND so that the transistors 162 in the (k+1)-th to m-th rows are turned off. BL_1 is supplied with the potential V2, and BL_2 to BL_n are supplied with the potential V4.

Note that G_1 is supplied with GND so that the selection transistors 180 are turned off, and G_2 is supplied with the potential V1 so that the selection transistors 182 are turned on. WL_(k+1) to WL_m may be supplied with the potential V5.

As a result, the node FG in the memory cell in the k-th row and the first column is supplied with the potential V2. In other words, data "1" is written to the memory cell in the k-th row and the first column. Further, the nodes FG of the memory cells in the k-th row and the second to n-th columns are supplied with the potential V4. In other words, data "0" is written to the memory cells in the k-th row and the second to n-th columns.

In such a manner, in the semiconductor device described in this embodiment, when data is written to the memory cells 190 in the k-th row (k is a natural number greater than or equal to 1 and less than or equal to m), the transistors 162 in the first to k-th rows need to be turned on; therefore, data is preferably written to the memory cell array sequentially from the m-th row.

When data reading is performed in the k-th row, S_1 to S_m are set at GND so that all the transistors 162 are turned off, and the selection line G_1 and the selection line G_2 are supplied with the potential V1 so that the selection transistors 180 and the selection transistors 182 are turned on. WL_k connected to the memory cells 190 in the k-th row from which data is to be read is set at GND, and WL_1 to WL_(k−1) and WL_(k+1) to WL_m connected to the memory cells 190 from which data is not to be read are supplied with the potential V5.

In the case where a configuration is employed in which the selection line G_1 and the selection transistor 180 are omitted and only the selection line G corresponding to the selection line G_2 and the selection transistors 182 are provided as illustrated in FIG. 3, data writing, data holding, data reading, and data erasing in a plurality of rows at a time can also be performed basically in the same manner as in the above operations.

Note that as for the selection line G, the operation is slightly different from that in the semiconductor device in FIG. 2. Here, the potential of the selection line G in each operation is described with reference to FIG. 5 which is a timing chart for the detailed operations of the semiconductor device in FIG. 3. In the same manner as the timing chart in FIG. 4, the timing chart in FIG. 5 shows the relationship among potentials of the lines in the case where data "1" is written to the memory cell in the k-th row and the first column and data "0" is written to the memory cells in the k-th row and the other columns (the second to n-th columns) (data writing in the k-th row) and in the case where data written in the memory cells in the k-th row are read out (data reading in the k-th row). Thus, a difference between the timing chart in FIG. 5 and the timing chart in FIG. 4 is only the potential of the selection line G, and is described below.

When data writing is performed in the k-th row, the potential of the selection line G is set to GND so that the selection transistors 182 are turned off. When data reading is performed in the k-th row, the selection line G is supplied with the potential V1 so that the selection transistors 182 are turned on. In the operations of the semiconductor device in FIG. 3, the selection line G is supplied with potentials in such a manner, whereby operations similar to the above operations in the timing chart in FIG. 4 can be performed.

Note that in the above configuration where the data holding period is extended by devising the relationship among potentials, there is a case where the data holding period of the memory cell 190 at an end of the plurality of memory cells 190 connected in series cannot be extended. For example, in the semiconductor device illustrated in FIG. 2, there is a case where a slight amount of current may flow in the transistor 162 depending on the potential of the bit line BL because the transistor 162 of the memory cell 190 in the first row is directly connected to the bit line BL. Therefore, there is a case where the data holding period of the memory cell 190 in the first row cannot be extended as compared to the memory cells in other rows.

This problem can be solved by employing a configuration in which the capacitance of the capacitor 164 of the memory cell 190 at an end is set larger than the capacitance of the capacitors 164 of the other memory cells 190. By increasing the capacitance, a change in potential can be decreased with respect to the same leakage current. As a result, the data holding period of the memory cell 190 at an end can be extended, and the holding period of all the memory cells (the period for which all the memory cells can hold data) can be extended.

For example, a configuration may be employed in which the channel length of the transistor 162 of the memory cell 190 at an end is set longer than the channel length of the transistors 162 of the other memory cells 190. By increasing the channel length, a decrease in threshold value due to a short-channel effect can be suppressed and the leakage current can be reduced. A decrease in leakage current due to an increase in channel resistance can also be expected. As a result, the data holding period of the memory cell 190 at an end can be extended, and the holding period of all the memory cells (the period for which all the memory cells can hold data) can be extended.

For example, a configuration may be employed in which the memory cell 190 at an end of the plurality of memory cells 190 connected in series is used as a dummy cell and is not used for data holding. By employing such a configuration, the holding period of all the memory cells (the period for which all the memory cells can hold data) can be extended.

All of these measures can be taken with little increase in the area per bit because the measures only need to be taken in a memory cell at an end of memory cells connected in series (in the above configuration, the memory cell in the first row). For example, there is a very small increase in area as compared to the case of using a large capacitor in each memory cell or the case of increasing the channel length.

In the semiconductor device described in this embodiment, transistors including an oxide semiconductor are used. Since the off-state current of the transistors including an oxide semiconductor is extremely small, stored data can be held for an extremely long time owing to such transistors. In other words, refresh operation becomes unnecessary or the frequency of the refresh operation can be extremely lowered, which leads to a sufficient reduction in power consumption. Moreover, stored data can be held for a long period even when power is not supplied (note that a potential is preferably fixed).

Further, in the semiconductor device described in this embodiment, high voltage is not needed for writing data and there is no problem of deterioration of elements. For example, unlike a conventional nonvolatile memory, it is not necessary to inject and extract electrons into and from a floating gate, and thus a problem such as deterioration of a gate insulating layer does not arise at all. That is, the semiconductor device according to the disclosed invention does not have a limitation on the number of times data can be rewritten, which is a problem of a conventional nonvolatile memory, and the reliability thereof is drastically improved. Furthermore, since data is written by turning on or off the transistors, high-speed operation can be easily realized.

Since a transistor including a material other than an oxide semiconductor can operate at sufficiently high speed, when this is combined with a transistor including an oxide semiconductor, a semiconductor device can perform operation (e.g., data reading) at sufficiently high speed. Further, a transistor including a material other than an oxide semiconductor can favorably realize a variety of circuits (e.g., a logic circuit or a driver circuit) which needs to operate at high speed.

A semiconductor device having a novel feature can be realized by being provided with both the transistor including a material other than an oxide semiconductor (in a broader sense, a transistor capable of operating at sufficiently high speed) and the transistor including an oxide semiconductor (in a broader sense, a transistor whose off-state current is sufficiently small).

In the semiconductor device described in this embodiment, the transistors each including an oxide semiconductor in the memory cells of the semiconductor device are connected in series; thus, the source terminal of the transistor including an oxide semiconductor in the memory cell and the drain terminal of the transistor including an oxide semiconductor in the adjacent memory cell can be connected to each other. That is, in each memory cell, one of the source terminal and the drain terminal of the transistor including an oxide semiconductor does not need to be connected to a wiring through an opening. Therefore, the area occupied by the memory cells can be reduced, whereby the degree of integration of the semiconductor device can be increased and the storage capacity per unit area can be increased.

By satisfying a predetermined relationship among potentials supplied in the above-described semiconductor device, transistors including an oxide semiconductor can be sufficiently turned off and the data holding period can be extended.

The configurations, methods, and the like described in this embodiment can be combined as appropriate with any of the configurations, methods, and the like described in the other embodiments.

Embodiment 2

In this embodiment, a structure and a manufacturing method of a semiconductor device according to one embodiment of the disclosed invention will be described with reference to FIGS. 6A and 6B, FIGS. 7A and 7B, FIGS. 8A and 8B, FIGS. 9A to 9D, FIGS. 10A to 10D, FIGS. 11A to 11D, and FIGS. 12A to 12D.

<Cross-sectional Structure and Planar Structure of Semiconductor Device>

Figure 6A:
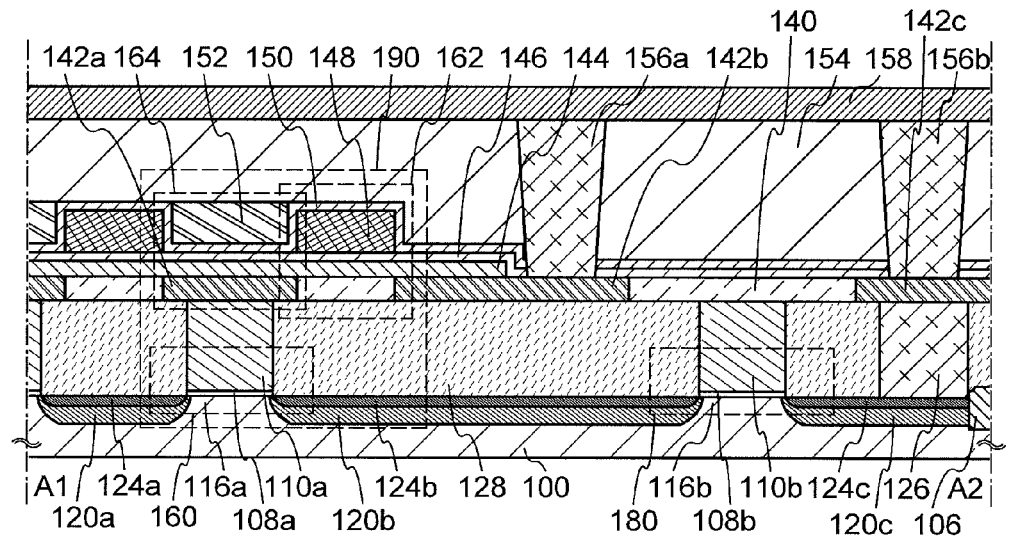
FIGS. 6A and 6B are a cross-sectional view and a plan view of a semiconductor device.
Figure 6B:
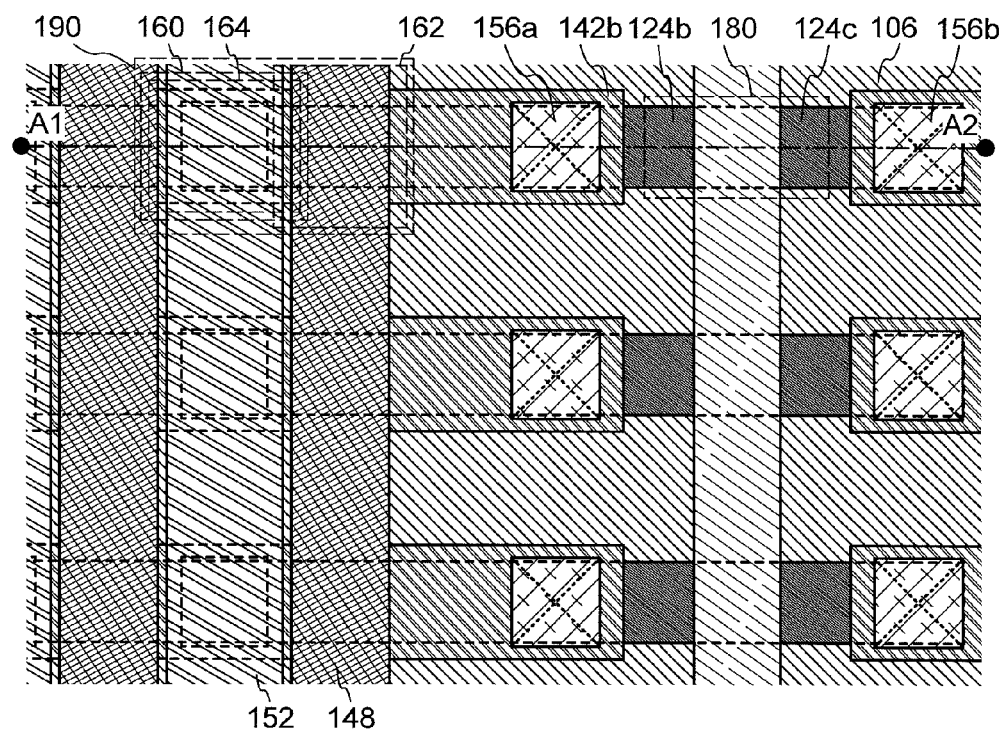

FIGS. 6A and 6B illustrate an example of a structure of the memory cell 190 and the selection transistor 180 in the semiconductor device illustrated in the circuit diagram of FIG. 2. FIG. 6A is a cross-sectional view of the semiconductor device, and FIG. 6B is a plan view of the semiconductor device. Here, FIG. 6A corresponds to a cross section along line A1-A2 in FIG. 6B. In FIG. 6B, a direction parallel to line A1-A2 corresponds to the column direction in the circuit diagram of FIG. 2, and a direction perpendicular to line A1-A2 corresponds to the row direction in the circuit diagram of FIG. 2. The semiconductor device illustrated in FIGS. 6A and 6B includes a transistor 160 including a first semiconductor material and a selection transistor 180 in a lower portion, and a transistor 162 including a second semiconductor material and a capacitor 164 in an upper portion. Note that although the transistor 160 and the transistor 162 in the first row are illustrated in FIGS. 6A and 6B, as for the transistors 160 and the transistors 162 in the first to m-th rows, the source electrode (source region) in the memory cell and the drain electrode (drain region) in the adjacent memory cell are connected in series as illustrated in the circuit diagram of FIG. 2.

Here, the first semiconductor material and the second semiconductor material are preferably different materials. For example, the first semiconductor material can be a semiconductor material (such as silicon) other than an oxide semiconductor, and the second semiconductor material can be an oxide semiconductor. A transistor including a material other than an oxide semiconductor, such as single crystal silicon, can operate at high speed easily. On the other hand, a transistor including an oxide semiconductor can hold electric charge for a long time owing to its characteristics.

Although all the above transistors are n-channel transistors in the following description, it is needless to say that p-channel transistors can be used. The technical nature of the disclosed invention is to use a semiconductor material with which off-state current can be sufficiently decreased, such as an oxide semiconductor, in the transistor 162 so that data can be held. Therefore, it is not necessary to limit a specific structure of the semiconductor device, such as a material of the semiconductor device or a structure of the semiconductor device, to the structure described here.

The transistor 160 in FIGS. 6A and 6B includes a channel formation region 116a provided in a substrate 100 including a semiconductor material (such as silicon), an impurity region 120a and an impurity region 120b provided such that the channel formation region 116a is sandwiched therebetween, a metal compound region 124a and a metal compound region 124b in contact with the impurity region 120a and the impurity region 120b, a gate insulating layer 108a provided over the channel formation region 116a, and a gate electrode 110a provided over the gate insulating layer 108a. Note that a transistor whose source electrode and drain electrode are not illustrated in a drawing may also be referred to as a transistor for the sake of convenience. Further, in such a case, in description of a connection of a transistor, a source region and a source electrode may be collectively referred to as a source electrode, and a drain region and a drain electrode may be collectively referred to as a drain electrode. That is, in this specification, the term "source electrode" may include a source region and the term "drain electrode" may include a drain region.

Note that in this specification, the impurity region 120a, the impurity region 120b, and an impurity region 120c which is described later are collectively referred to as impurity regions 120 in some cases. Further, in this specification, the metal compound region 124a, the metal compound region 124b, and a metal compound region 124c which is described later are collectively referred to as metal compound regions 124 in some cases.

Here, the transistors 160 in the first to m-th rows share the impurity regions 120 and the metal compound regions 124 functioning as source regions and drain regions, and are connected in series. That is, the impurity region 120 and the metal compound region 124 functioning as a source region of the transistor 160 in the (l−1)-th row (l is a natural number greater than or equal to 2 and less than or equal to m) function as a drain region of the transistor 160 in the l-th row. In this manner, the transistors 160 of the memory cells 190 are connected in series, whereby the source regions and the drain regions can be shared by the transistors 160 of the memory cells 190. That is, in each of the memory cells 190, one of the source region and the drain region of the transistor 160 does not need to be connected to a wiring 158 through an opening.

Therefore, the opening for connection with the wiring 158 does not need to be provided in the planar layout of the transistor 160, and the planar layout of the transistor 160 can easily overlap with the planar layout of the transistor 162 which is described later; thus, the area occupied by the memory cells 190 can be reduced.

The transistor 160 in the first row is electrically connected to the bit line through the selection transistor 180; thus, the impurity region 120b and the metal compound region 124b functioning as a drain region of the transistor 160 in the first row function as a source region of the selection transistor 180. Here, the selection transistor 180 can have the same structure as the transistor 160 described above. That is, the selection transistor 180 includes a channel formation region 116b provided in the substrate 100 including a semiconductor material (e.g., silicon); the impurity region 120b and the impurity region 120c provided such that the channel formation region 116b is sandwiched therebetween; the metal compound region 124b and the metal compound region 124c in contact with the impurity region 120b and the impurity region 120c; a gate insulating layer 108b provided over the channel formation region 116b; and a gate electrode 110b provided over the gate insulating layer 108b. Note that the gate electrode 110b of the selection transistor 180 functions as the selection line G_1 in the circuit diagram of FIG. 2.

Note that in this specification, the channel formation region 116a and the channel formation region 116b are collectively referred to as channel formation regions 116 in some cases. Further, in this specification, the gate insulating layer 108a and the gate insulating layer 108b are collectively referred to as gate insulating layers 108 in some cases. Furthermore, in this specification, the gate electrode 110a and the gate electrode 110b are collectively referred to as gate electrodes 110 in some cases.

The substrate 100 is provided with an element isolation insulating layer 106 which surrounds the transistor 160 and the selection transistor 180. An insulating layer 128 is provided over the transistor 160 and the selection transistor 180 so as to expose top surfaces of the gate electrodes 110. Note that for higher integration, it is preferable that, as in FIGS. 6A and 6B, the transistor 160 does not have a sidewall insulating layer. On the other hand, when the characteristics of the transistor 160 have priority, the sidewall insulating layer may be formed on a side surface of the gate electrode 110 and the impurity regions 120 may include a region having a different impurity concentration.

Here, the insulating layer 128 preferably has a surface with favorable planarity; for example, the surface of the insulating layer 128 preferably has a root-mean-square (RMS) roughness of 1 nm or less.

The transistor 162 in FIGS. 6A and 6B includes a source electrode 142a and a drain electrode 142b which are embedded in an insulating layer 140 formed over the insulating layer 128; an oxide semiconductor layer 144 in contact with part of the insulating layer 140, the source electrode 142a, and the drain electrode 142b; a gate insulating layer 146 covering the oxide semiconductor layer 144; and a gate electrode 148 provided over the gate insulating layer 146 so as to overlap with the oxide semiconductor layer 144. Note that the gate electrode 148 functions as the signal line S in the circuit diagram of FIG. 2.

Here, the oxide semiconductor layer 144 is preferably an oxide semiconductor layer which is purified by sufficiently removing an impurity such as hydrogen therefrom or by sufficiently supplying oxygen thereto. Specifically, the hydrogen concentration of the oxide semiconductor layer 144 is $5\times10^{19}$ atoms/cm$^3$ or less, preferably $5\times10^{18}$ atoms/cm$^3$ or less, more preferably $5\times10^{17}$ atoms/cm$^3$ or less, for example. Note that the above hydrogen concentration of the oxide semiconductor layer 144 is measured by secondary ion mass spectrometry (SIMS). The density of carriers generated due to a donor such as hydrogen in the oxide semiconductor layer 144, in which hydrogen is reduced to a sufficiently low concentration so that the oxide semiconductor layer is purified and in which defect states in an energy gap due to oxygen deficiency are reduced by sufficiently supplying oxygen as described above, is less than $1\times10^{12}$/cm$^3$, preferably less than $1\times10^{11}$/cm$^3$, more preferably less than $1.45\times10^{10}$/cm$^3$. In addition, for example, the off-state current (per unit channel width (1 μm), here) at room temperature (25° C.) is 100 zA (1 zA (zeptoampere) is $1\times10^{-21}$ A) or less, preferably 10 zA or less. In this manner, by using an i-type (intrinsic) or substantially i-type oxide semiconductor, the transistor 162 which has extremely favorable off-state current characteristics can be obtained.

In addition, a region which is part of a surface of the insulating layer 140 and is in contact with the oxide semiconductor layer 144 preferably has a root-mean-square (RMS) roughness of 1 nm or less. In this manner, the channel formation region of the transistor 162 is provided in an extremely flat region having a root-mean-square (RMS) roughness of 1 nm or less, whereby the transistor 162 which can prevent a malfunction such as a short-channel effect and has favorable characteristics can be provided even when the transistor 162 is miniaturized.

The transistors 162 in the first to m-th rows share the source electrodes 142a and the drain electrodes 142b, and are connected in series. That is, the source electrode 142a of the transistor 162 in the (l−1)-th row (l is a natural number greater than or equal to 2 and less than or equal to m) and the drain electrode 142b of the transistor 162 in the l-th row are formed using the same conductive layer.

In this manner, the transistors 162 of the memory cells 190 are connected in series, whereby the source electrode 142a of the transistor 162 in the memory cell 190 and the drain electrode 142b of the transistor 162 in the adjacent memory cell 190 can be connected to each other. Thus, only one of the source electrode 142a and the drain electrode 142b of the transistor 162 is included in the planar layout of the memory cell 190. That is, the length in the column direction in the planar layout of the memory cell 190 can be as small as about the sum of the minimum width of the gate electrode 148 and the minimum distance between the gate electrodes 148.

On the other hand, in the case where the transistors 162 of the memory cells 190 are connected in parallel and the source electrode 142a and the drain electrode 142b are provided for each of the transistors 162 in the memory cells 190, one of the source electrode 142a and the drain electrode 142b of the transistor 162 of the memory cell 190 needs to be connected to a wiring such as the wiring 158 through an opening. Thus, both the source electrode 142a and the drain electrode 142b of the transistor 162 and the opening for connection with the wiring are included in the planar layout of the memory cell 190.

Therefore, the structure illustrated in FIGS. 6A and 6B is employed for the planar layout of the memory cell 190, whereby the area occupied by the memory cell 190 can be reduced. For example, given that the minimum feature size is F, the area occupied by the memory cell 190 can be approximately 4 F$^2$ to 12 F$^2$. Accordingly, the degree of integration of the semiconductor device can be increased, and the storage capacity per unit area can be increased.

The capacitor 164 in FIGS. 6A and 6B includes the source electrode 142a; the oxide semiconductor layer 144; the gate insulating layer 146; and an insulating layer 150 and an electrode 152 over the gate insulating layer 146. That is, the source electrode 142a functions as one electrode of the capacitor 164, and the electrode 152 functions as the other electrode of the capacitor 164. Note that the gate insulating layer 146 is not necessarily provided in the capacitor 164. With such a structure, a dielectric layer in the capacitor 164 is formed of the oxide semiconductor layer 144 and the insulating layer 150, whereby the thickness of the dielectric layer can be reduced and the capacitance of the capacitor 164 can be increased.

Here, one electrode of the capacitor 164 in the (l−1)-th row (l is a natural number greater than or equal to 2 and less than or equal to m) is the source electrode 142a of the transistor 162 in the (l−1)-th row; therefore, the planar layout of the capacitor 164 can easily overlap with the planar layout of the transistor 162, and the area occupied by the memory cells 190 can be reduced. The electrode 152 is formed over the insulating layer 150, whereby the gate electrodes 148 in the adjacent memory cells 190 can be formed with the minimum distance and the electrode 152 can be formed between the gate electrodes 148 in the adjacent memory cells 190. Therefore, the area occupied by the memory cells 190 can be reduced. Note that the electrode 152 functions as the word line WL in the circuit diagram of FIG. 2.

The insulating layer 150 is provided over the transistor 162, and an insulating layer 154 is provided over the insulating layer 150 and the electrode 152 of the capacitor 164. In an opening formed in the gate insulating layer 146, the insulating layer 150, the insulating layer 154, and the like, an electrode 156a is provided. Over the insulating layer 154, the wiring 158 connected to the electrode 156a is formed. The wiring 158 and the metal compound region 124c functioning as a drain region of the selection transistor 180 are electrically connected to each other through an electrode 156b provided in an opening formed in the gate insulating layer 146, the insulating layer 150, the insulating layer 154, and the like, through an electrode 142c embedded in the insulating layer 140, and through an electrode 126 embedded in the insulating layer 128. Here, the wiring 158 functions as the bit line BL in the circuit diagram of FIG. 2.

With the above structure, the size of the planar layout of the memory cell 190 including the transistor 160, the transistor 162, and the capacitor 164 can be reduced. In the planar layout of the memory cell 190, the length in the row direction can be reduced as small as about the sum of the minimum width of the wiring 158 functioning as the bit line BL and the minimum distance between the wirings 158. In addition, in the planar layout of the memory cell 190, the length in the column direction can be reduced as small as about the sum of the minimum width of the gate electrode 148 and the minimum distance between the gate electrodes 148. When such a planar layout is employed, the degree of integration of the circuit in FIG. 2 can be increased. For example, when F is used to express the minimum feature size, the area occupied by the memory cell can be expressed as $4F^2$ to $12F^2$. Accordingly, the storage capacity per unit area of the semiconductor device can be increased.

Note that the structure of a semiconductor device according to an embodiment of the disclosed invention is not limited to that illustrated in FIGS. 6A and 6B. Since the technical idea of an embodiment of the disclosed invention is to form a stacked-layer structure with an oxide semiconductor and a material other than an oxide semiconductor, the details such as an electrode connection can be changed as appropriate.

Figure 7A:
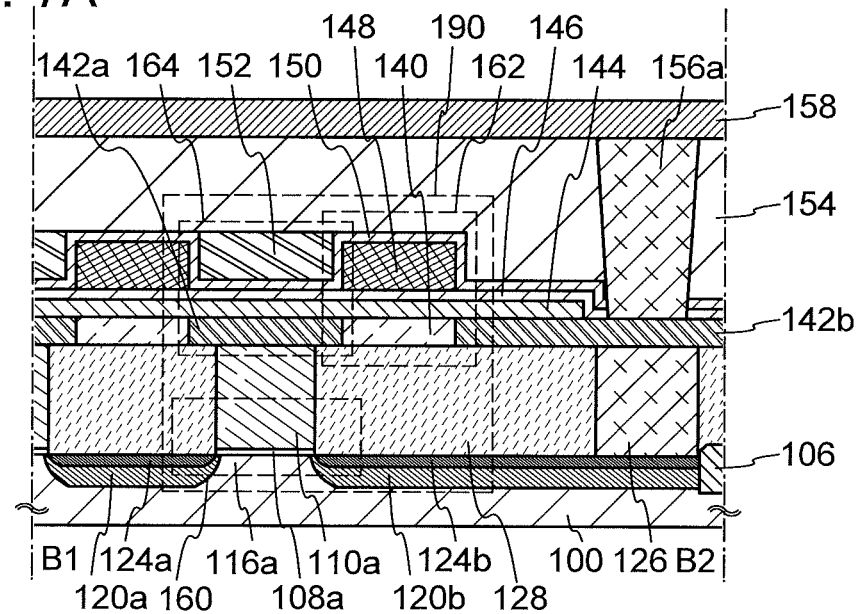
FIGS. 7A and 7B are a cross-sectional view and a plan view of a semiconductor device.
Figure 7B:
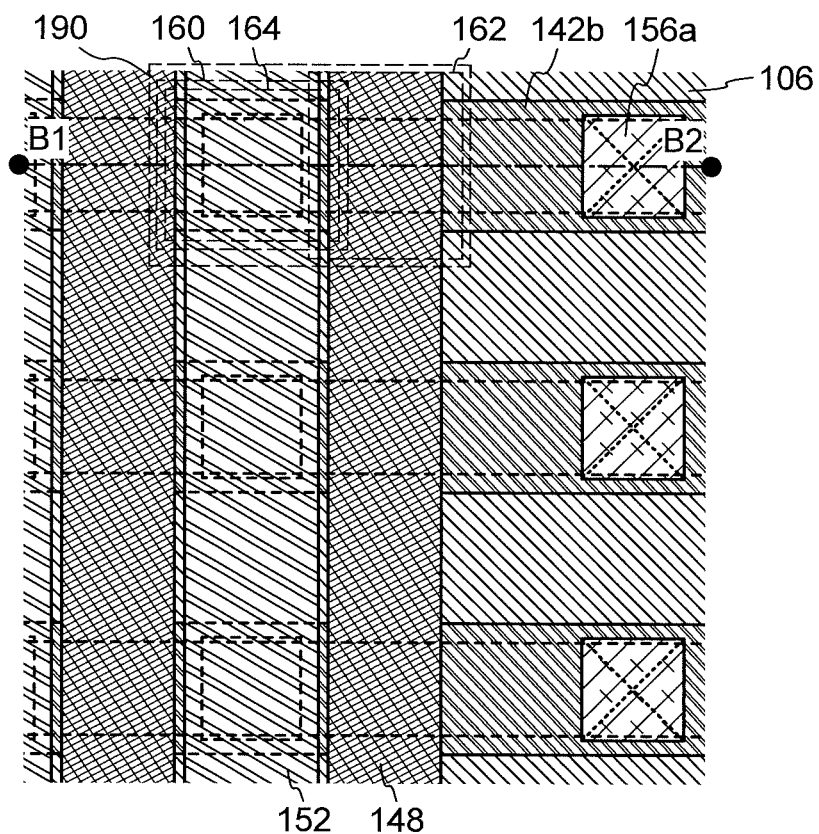

For example, as illustrated in FIG. 3, in the case where a structure is employed in which the selection line G_1 and the selection transistors 180 are omitted and only the selection line G corresponding to the selection line G_2 and the selection transistors 182 are provided, one example of a structure of a connection portion between the memory cell 190 in the first row and the bit line BL is illustrated in FIGS. 7A and 7B. FIG. 7A is a cross-sectional view of the semiconductor device, and FIG. 7B is a plan view of the semiconductor device. Here, FIG. 7A corresponds to a cross section taken along line B1-B2 in FIG. 7B.

One of differences between the semiconductor device illustrated in FIGS. 7A and 7B and the semiconductor device illustrated in FIGS. 6A and 6B is whether the selection transistors 180 are provided or not. Thus, the details of the semiconductor device illustrated in FIGS. 6A and 6B can be referred to for the details of the semiconductor device illustrated in FIGS. 7A and 7B. In the semiconductor device illustrated in FIGS. 7A and 7B, the same reference numerals are used to denote the same portions as those in FIGS. 6A and 6B.

Note that unlike in the semiconductor device illustrated in FIGS. 6A and 6B, the wiring 158 and the transistor 160 are electrically connected to each other through the electrode 156a provided in the opening formed in the gate insulating layer 146, the insulating layer 150, and the insulating layer 154, through the drain electrode 142b embedded in the insulating layer 140, and through the electrode 126 embedded in the insulating layer 128.

Figure 8A:
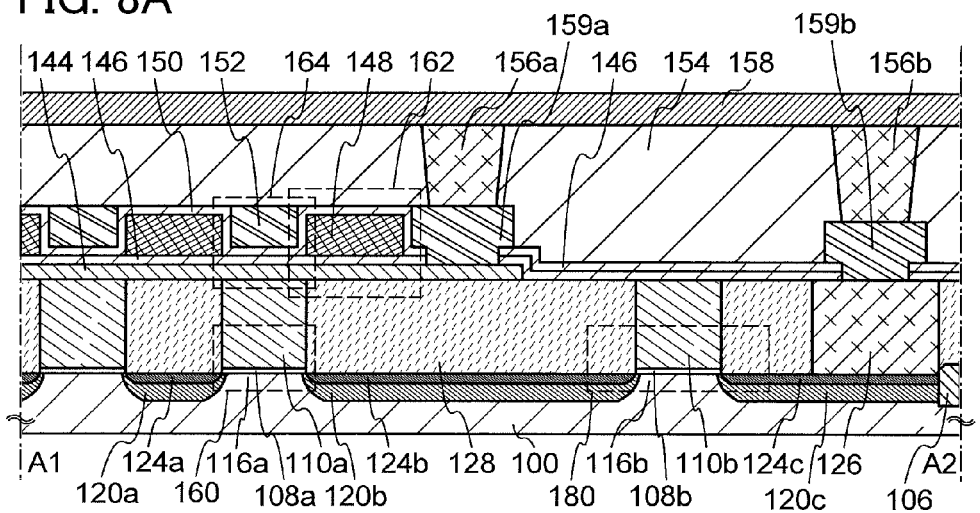
FIGS. 8A and 8B are each a cross-sectional view of a semiconductor device.

Note that the semiconductor device illustrated in FIGS. 6A and 6B has a structure in which the oxide semiconductor layer 144 is provided over the insulating layer 140 and the source electrode 142a and the drain electrode 142b embedded in the insulating layer 140; however, as illustrated in FIG. 8A, a structure may be employed in which the insulating layer 140 and the source electrode 142a and the drain electrode 142b embedded in the insulating layer 140 are not provided and the oxide semiconductor layer 144 is provided on and in direct contact with the gate electrode 110a and the insulating layer 128. Here, FIG. 8A illustrates a cross-sectional view of a semiconductor device. A main difference between the semiconductor device illustrated in FIG. 8A and the semiconductor device illustrated in FIGS. 6A and 6B is whether the insulating layer 140, the source electrode 142a, and the drain electrode 142b are provided or not. In the semiconductor device illustrated in FIG. 8A, the same reference numerals are used to denote the same portions as those in FIGS. 6A and 6B.

Here, in the semiconductor device illustrated in FIG. 8A, a structure can be employed in which the gate electrode 110a functions as a source electrode or a drain electrode of the transistor 162. That is, the gate electrode 110a of the transistor 160 in the (l−1)-th row (l is a natural number greater than or equal to 2 and less than or equal to m), the source electrode of the transistor 162 in the (l−1)-th row, and the drain electrode of the transistor 162 in the l-th row are formed using the same conductive layer. In the semiconductor device illustrated in FIGS. 6A and 6B, the length of the gate electrode 110a in the column direction is smaller than the length of the source electrode 142a in the column direction in consideration of a contact; therefore, in the semiconductor device illustrated in FIG. 8A in which the source electrode 142a is not provided, the area occupied by the memory cells 190 can be further reduced.

In the semiconductor device illustrated in FIG. 8A, an electrode 159a is preferably provided between the electrode 156a and the oxide semiconductor layer 144 so that the wiring 158 and the oxide semiconductor layer 144 can be electrically connected to each other. With such a structure, a contact between the wiring 158 and the oxide semiconductor layer 144 can be obtained easily and reliably. Similarly, a structure may be employed in which an electrode 159b is provided between the electrode 156b and the electrode 126 so that the wiring 158 and the metal compound region 124c of the selection transistor 180 are electrically connected to each other. Note that the electrode 159a and the electrode 159b can be formed at the same time as the formation of the electrode 152.

Figure 8B:
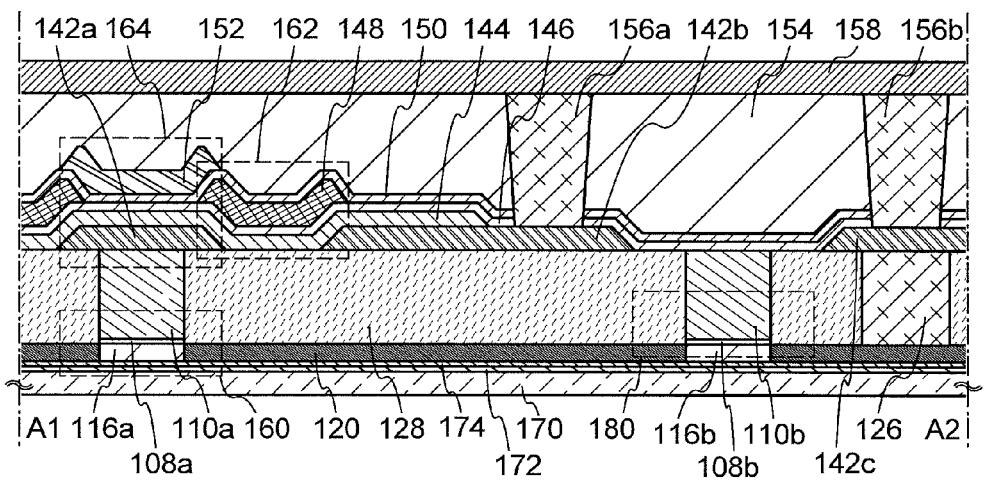

As illustrated in FIG. 8B, a structure may be employed in which the transistor 160 and the selection transistor 180 are formed over an SOI substrate. Here, FIG. 8B illustrates a cross-sectional view of a semiconductor device. One of differences between the semiconductor device illustrated in FIG. 8B and the semiconductor device illustrated in FIGS. 6A and 6B is that the channel formation regions 116 and the impurity regions 120 of the transistor 160 and the selection transistor 180 are formed using a semiconductor layer provided in the SOI substrate. In the semiconductor device illustrated in FIG. 8B, the same reference numerals are used to denote the same portions as those in FIGS. 6A and 6B.

The SOI substrate illustrated in FIG. 8B includes a base substrate 170, a nitrogen-containing layer 172 formed over the base substrate 170, an oxide film 174 faulted over the nitrogen-containing layer 172, and the semiconductor layer formed over the oxide film 174. The channel formation regions 116 and the impurity regions 120 of the transistor 160 and the selection transistor 180 are formed using the semiconductor layer.

Here, as the base substrate 170, a substrate formed of an insulator can be used. Specifically, it is possible to use a variety of glass substrates used for the electronics industry, such as an aluminosilicate glass substrate, an aluminoborosilicate glass substrate, or a barium borosilicate glass substrate as well as a quartz substrate, a ceramic substrate, a sapphire substrate, or the like. Further, a ceramic substrate which contains silicon nitride and aluminum nitride as its main components and whose coefficient of thermal expansion is close to that of silicon may be used.

As the nitrogen-containing layer 172, a layer including an insulating film containing nitrogen, such as a silicon nitride ($SiN_x$) film or a silicon nitride oxide ($SiN_xO_y$ (x>y)) film can be used. The oxide film 174 can be formed with a single layer or a stacked layer of a silicon oxide film, a silicon oxynitride film, or the like.

As the semiconductor layer for forming the channel formation regions 116 and the impurity regions 120, a semiconductor layer which is formed using a single crystal semiconductor substrate that is formed of an element belonging to Group 14 of the periodic table, such as a single crystal silicon substrate, a single crystal germanium substrate, or a single crystal silicon germanium substrate, and which has a thickness of 10 nm to 500 nm, preferably 50 nm to 200 nm may be used.

The semiconductor device illustrated in FIGS. 6A and 6B has a structure in which the source electrode 142a and the drain electrode 142b are embedded in the insulating layer 140; however, as illustrated in FIG. 8B, a structure may be employed in which the source electrode 142a and the drain electrode 142b are not embedded in the insulating layer and are provided over the gate electrode 110 and the insulating layer 128. Here, end portions of the source electrode 142a and the drain electrode 142b preferably have tapered shapes. When the end portions of the source electrode 142a and the drain electrode 142b are tapered, the coverage thereof with the oxide semiconductor layer 144 can be improved and a breaking thereof can be prevented. Here, the taper angle is in the range of 30° to 60°, for example. Note that the "taper angle" means an angle formed by the side surface and the bottom surface of a layer having a tapered shape (for example, the source electrode 142a) when observed from a direction perpendicular to a cross section thereof (a plane perpendicular to the substrate surface).

<Method for Manufacturing Semiconductor Device>

Next, an example of a method for manufacturing the above-described semiconductor device will be described. First, a method for manufacturing the transistor 160 and the selection transistor 180 in the lower portion will be described below with reference to FIGS. 9A to 9D and FIGS. 10A to 10D; then, a method for manufacturing the transistor 162 in the upper portion and the capacitor 164 will be described with reference to FIGS. 11A to 11D and FIGS. 12A to 12D.

<Method for Manufacturing Transistors in Lower Portion>

Figure 9A:
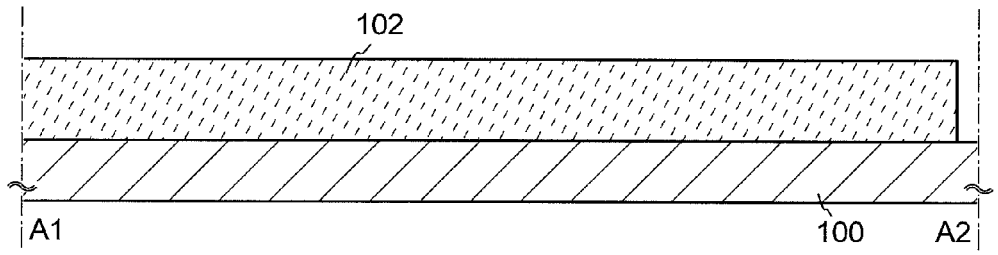
FIGS. 9A to 9D are cross-sectional views illustrating a manufacturing process of a semiconductor device.
Figure 9B:
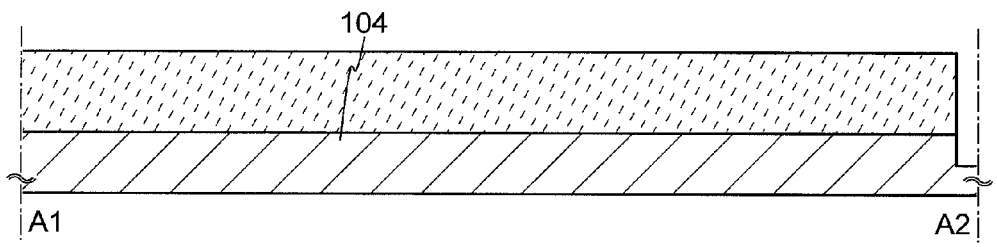

First, the substrate 100 including a semiconductor material is prepared (see FIG. 9A). A single crystal semiconductor substrate or a polycrystalline semiconductor substrate of silicon, silicon carbide, or the like, a compound semiconductor substrate of silicon germanium or the like, an SOI substrate, or the like can be used as the substrate 100 including a semiconductor material. Here, an example of the case where a single crystal silicon substrate is used as the substrate 100 including a semiconductor material is described. Note that the term "SOT substrate" generally means a substrate where a silicon semiconductor layer is provided over an insulating surface. In this specification and the like, the term "SOI substrate" also means a substrate where a semiconductor layer including a material other than silicon is provided over an insulating surface. That is, a semiconductor layer included in the "SOT substrate" is not limited to a silicon semiconductor layer. Moreover, the SOT substrate can be a substrate having a structure in which a semiconductor layer is provided over an insulating substrate such as a glass substrate, with an insulating layer interposed therebetween.

It is preferable that a single crystal semiconductor substrate of silicon or the like be particularly used as the substrate 100 including a semiconductor material because the speed of reading operation of the semiconductor device can be increased.

Note that an impurity element may be added to regions which later function as the channel formation region 116a of the transistor 160 and the channel formation region 116b of the selection transistor 180, in order to control the threshold voltages of the transistors. Here, an impurity element imparting conductivity is added so that the threshold voltages of the transistor 160 and the selection transistor 180 become positive. When the semiconductor material is silicon, the impurity imparting conductivity may be boron, aluminum, gallium, or the like. Note that it is preferable to perform heat treatment after adding the impurity element, in order to activate the impurity element or reduce defects which may be generated during addition of the impurity element.

A protective layer 102 serving as a mask for forming an element isolation insulating layer is formed over the substrate 100 (see FIG. 9A). As the protective layer 102, an insulating layer formed using a material such as silicon oxide, silicon nitride, silicon oxynitride, or the like can be used, for example.

Next, part of the substrate 100 in a region not covered with the protective layer 102 (i.e., in an exposed region) is removed by etching using the protective layer 102 as a mask. Thus, a semiconductor region 104 isolated from the other semiconductor regions is formed (see FIG. 9B). As the etching, dry etching is preferably performed, but wet etching may be performed. An etching gas or an etchant can be selected as appropriate depending on a material to be etched.

Figure 9C:
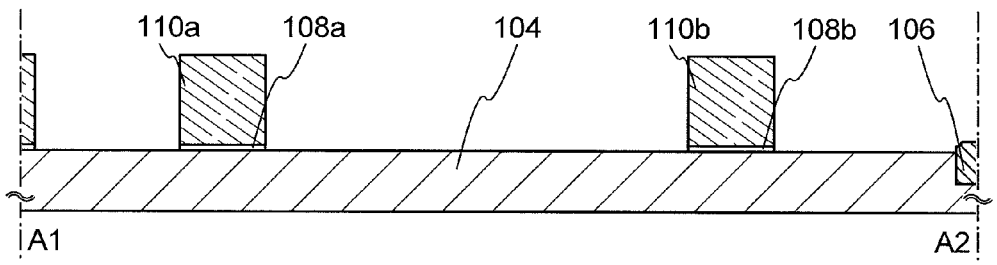

Then, an insulating layer is formed so as to cover the substrate 100, and the insulating layer in a region overlapping with the semiconductor region 104 is selectively removed; thus, the element isolation insulating layer 106 is formed (see FIG. 9C). The insulating layer is formed using silicon oxide, silicon nitride, silicon oxynitride, or the like. As a method for removing the insulating layer, any of etching treatment, polishing treatment such as chemical mechanical polishing (CMP) treatment, and the like can be employed. Note that the protective layer 102 is removed after the formation of the semiconductor region 104 or after the formation of the element isolation insulating layer 106.

Next, an insulating layer is formed over a surface of the semiconductor region 104, and a layer including a conductive material is formed over the insulating layer.

The insulating layer is processed into a gate insulating layer later and can be formed by, for example, heat treatment (thermal oxidation treatment, thermal nitridation treatment, or the like) of the surface of the semiconductor region 104. Instead of heat treatment, high-density plasma treatment may be employed. The high-density plasma treatment can be performed using, for example, a mixed gas of any of a rare gas such as helium (He), argon (Ar), krypton (Kr), or xenon (Xe), oxygen, nitrogen oxide, ammonia, nitrogen, hydrogen, and the like. It is needless to say that the insulating layer may be formed by a CVD method, a sputtering method, or the like. The insulating layer preferably has a single-layer structure or a stacked-layer structure with a film including silicon oxide, silicon oxynitride, silicon nitride, hafnium oxide, aluminum oxide, tantalum oxide, yttrium oxide, hafnium silicate (Hf-Si$_x$O$_y$ (x>0, y>0)), hafnium silicate to which nitrogen is added (HfSi$_x$O$_y$N$_z$(x>0, y>0, z>0)), hafnium aluminate to which nitrogen is added (HfAl$_x$O$_y$N$_z$(x>0, y>0, z>0)), or the like. The insulating layer can have a thickness of 1 nm to 100 nm, preferably, 10 nm to 50 nm, for example.

The layer including a conductive material can be formed using a metal material such as aluminum, copper, titanium, tantalum, or tungsten. The layer including a conductive material may be formed using a semiconductor material such as polycrystalline silicon. There is no particular limitation on the method for forming the layer including a conductive material, and a variety of film formation methods such as an evaporation method, a CVD method, a sputtering method, or a spin coating method can be employed. Note that this embodiment shows an example of the case where the layer including a conductive material is faulted using a metal material.

After that, the insulating layer and the layer including a conductive material are selectively etched; thus, the gate insulating layers 108 (the gate insulating layer 108a and the gate insulating layer 108b) and the gate electrodes 110 (the gate electrode 110a and the gate electrode 110b) are formed (see FIG. 9C).

Figure 9D:
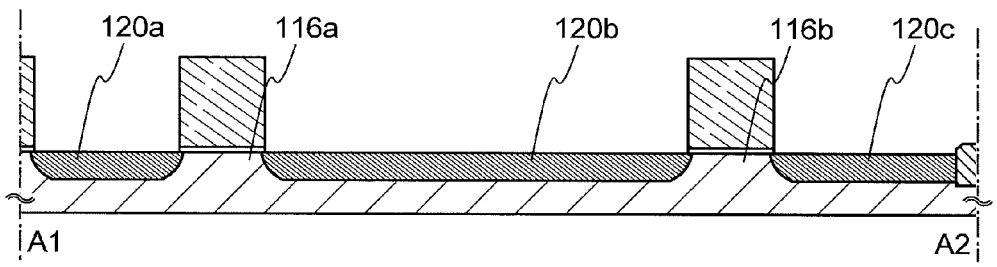

Next, phosphorus (P), arsenic (As), or the like is added to the semiconductor region 104, whereby the channel formation regions 116 (the channel formation region 116a and the channel formation region 116b) and the impurity regions 120 (the impurity region 120a, the impurity region 120b, and the impurity region 120c) are formed (see FIG. 9D). Note that phosphorus or arsenic is added here in order to form an n-type transistor; an impurity element such as boron (B) or aluminum (Al) may be added in the case of forming a p-type transistor. Here, the concentration of the impurity added can be set as appropriate; the concentration is preferably set high when a semiconductor element is highly miniaturized.

Note that a sidewall insulating layer may be formed around the gate electrodes 110, and impurity regions to which the impurity element is added at a different concentration may be formed.

Figure 10A:
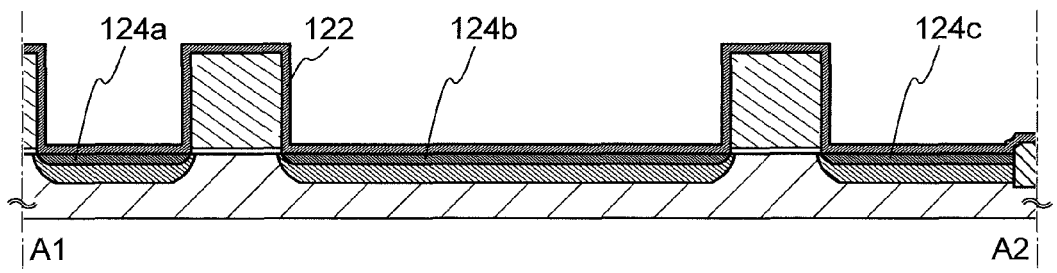
FIGS. 10A to 10D are cross-sectional views illustrating a manufacturing process of a semiconductor device.

Next, a metal layer 122 is formed so as to cover the gate electrodes 110, the impurity regions 120, and the like (see FIG. 10A). The metal layer 122 can be formed by a variety of film formation methods such as a vacuum evaporation method, a sputtering method, and a spin coating method. The metal layer 122 is preferably formed using a metal material which forms a low-resistance metal compound by reacting with the semiconductor material contained in the semiconductor region 104. Examples of such metal materials are titanium, tantalum, tungsten, nickel, cobalt, platinum, and the like.

Next, heat treatment is performed so that the metal layer 122 reacts with the semiconductor material. Thus, the metal compound regions 124 (the metal compound region 124a, the metal compound region 124b, and the metal compound region 124c) which are in contact with the impurity regions 120 (the impurity region 120a, the impurity region 120b, and the impurity region 120c) are formed (see FIG. 10A). Note that when the gate electrodes 110 are formed using polycrystalline silicon or the like, metal compound regions are also formed in portions of the gate electrodes 110 which are in contact with the metal layer 122.

As the heat treatment, irradiation with a flash lamp can be employed, for example. Although it is needless to say that another heat treatment method may be used, a method by which heat treatment can be achieved in an extremely short time is preferably used in order to improve the controllability of chemical reaction for formation of the metal compound. Note that the metal compound regions are formed by reaction of the metal material and the semiconductor material and have sufficiently high conductivity. The formation of the metal compound regions can properly reduce the electric resistance and improve element characteristics. Note that the metal layer 122 is removed after the metal compound regions 124 are formed.

Figure 10B:
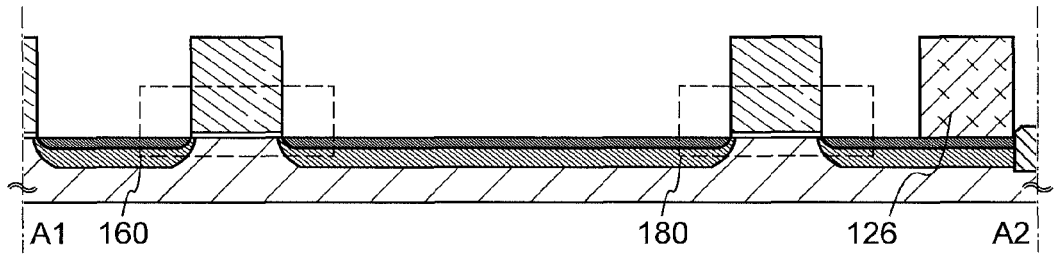

Next, the electrode 126 is formed on and in contact with the metal compound region 124c of the selection transistor 180 (see FIG. 10B). The electrode 126 is formed by forming a conductive layer by a PVD method such as a sputtering method, or a CVD method such as a plasma CVD method, and then by patterning the conductive layer. As a material of the conductive layer, an element selected from aluminum, chromium, copper, tantalum, titanium, molybdenum, and tungsten, an alloy including any of these elements as a component, or the like can be used. A material including one of manganese, magnesium, zirconium, beryllium, neodymium, and scandium or a combination of a plurality of these elements may be used. The details are similar to those of the source electrode 142a, the drain electrode 142b, and the like to be described below.

Through the above steps, the transistor 160 and the selection transistor 180 are formed with the use of the substrate 100 including a semiconductor material (see FIG. 10B). A feature of the transistor 160 is that it can operate at high speed. With the use of that transistor as a reading transistor, data can be read at high speed.

Figure 10C:
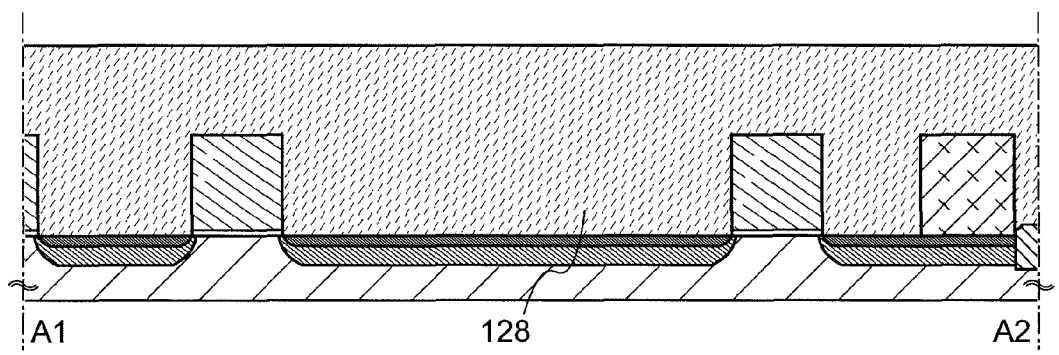

Next, the insulating layer 128 is formed so as to cover the components formed in the above steps (see FIG. 10C). The insulating layer 128 can be formed using an inorganic insulating material such as silicon oxide, silicon oxynitride, silicon nitride, or aluminum oxide. It is particularly preferable to use a low dielectric constant (low-k) material for the insulating layer 128 because capacitance due to overlap of electrodes or wirings can be sufficiently reduced. Note that a porous insulating layer with such a material may be employed as the insulating layer 128. A porous insulating layer has a lower dielectric constant than an insulating layer with high density, and thus allows a further reduction in capacitance generated by electrodes or wirings. Alternatively, the insulating layer 128 can be formed using an organic insulating material such as polyimide or acrylic. Note that although the insulating layer 128 has a single-layer structure in this embodiment, an embodiment of the disclosed invention is not limited to this example. The insulating layer 128 may have a stacked-layer structure including two or more layers.

Figure 10D:
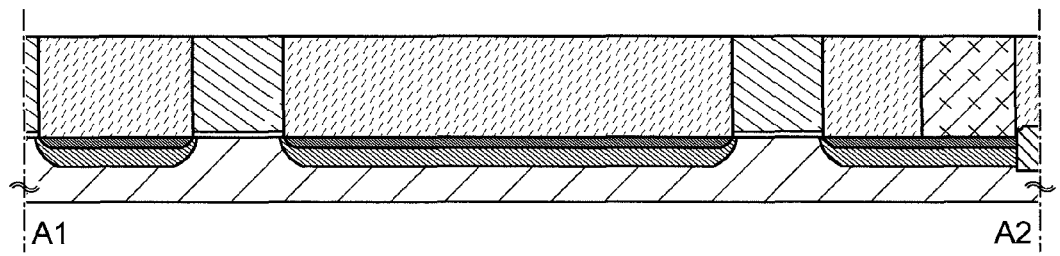

After that, as treatment performed before the transistor 162 and the capacitor 164 are formed, CMP treatment of the insulating layer 128 is performed so that upper surfaces of the gate electrode 110a, the gate electrode 110b, and the electrode 126 are exposed (see FIG. 10D). As the treatment for exposing the upper surfaces of the gate electrodes 110, etching treatment may be employed as an alternative to CMP treatment. Note that it is preferable to planarize the surface of the insulating layer 128 as much as possible in order to improve the characteristics of the transistor 162. For example, the surface of the insulating layer 128 preferably has a root-mean-square (RMS) roughness of 1 nm or less.

Note that before or after each of the above steps, a step of forming an electrode, a wiring, a semiconductor layer, an insulating layer, or the like may be further performed. For example, when the wiring has a multilayer wiring structure of a stacked-layer structure including insulating layers and conductive layers, a highly integrated semiconductor device can also be realized.

<Method for Manufacturing Transistor in Upper Portion>

Figure 11A:
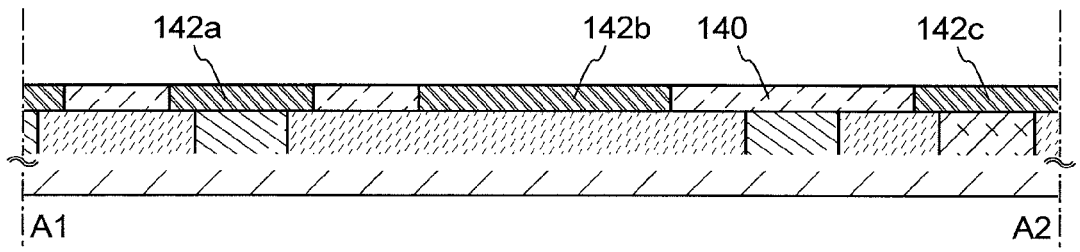
FIGS. 11A to 11D are cross-sectional views illustrating a manufacturing process of a semiconductor device.

Next, a conductive layer is formed over the gate electrodes 110, the electrode 126, the insulating layer 128, and the like, and the source electrode 142a, the drain electrode 142b, and the electrode 142c are formed by selectively etching the conductive layer (see FIG. 11A).

The conductive layer can be formed by a PVD method such as a sputtering method, or a CVD method such as a plasma CVD method. As a material of the conductive layer, an element selected from aluminum, chromium, copper, tantalum, titanium, molybdenum, and tungsten, an alloy including any of these elements as a component, or the like can be used. A material including one of manganese, magnesium, zirconium, beryllium, neodymium, and scandium or a combination of a plurality of these elements may be used.

The conductive layer may have a single-layer structure or a stacked-layer structure including two or more layers. For example, the conductive layer may have a single-layer structure of a titanium film or a titanium nitride film, a single-layer structure of an aluminum film including silicon, a two-layer structure in which a titanium film is stacked over an aluminum film, a two-layer structure in which a titanium film is stacked over a titanium nitride film, a three-layer structure in which a titanium film, an aluminum film, and a titanium film are stacked in this order, or the like. Note that the conductive layer having a single-layer structure of a titanium film or a titanium nitride film has an advantage in that it can be easily processed into the source electrode 142a, the drain electrode 142b, and the electrode 142c having a tapered shape.

The conductive layer may be formed using a conductive metal oxide. As the conductive metal oxide, indium oxide ($In_2O_3$), tin oxide ($SnO_2$), zinc oxide (ZnO), an indium oxide-tin oxide alloy ($In_2O_3$—$SnO_2$, which is abbreviated to ITO in some cases), an indium oxide-zinc oxide alloy ($In_2O_3$—ZnO), or any of these metal oxide materials including silicon or silicon oxide can be used.

Although either dry etching or wet etching may be performed as the etching of the conductive layer, dry etching which has high controllability is preferably used for miniaturization. The etching may be performed so that the source electrode 142a and the drain electrode 142b to be formed have a tapered shape. The taper angle can be in the range of, 30° to 60°, for example.

The channel length (L) of the transistor 162 in the upper portion is determined by a distance between upper edge portions of the source electrode 142a and the drain electrode 142b. Note that for light exposure for forming a mask in the case of manufacturing a transistor with a channel length (L) of less than 25 nm, light exposure is preferably performed with extreme ultraviolet light whose wavelength is several nanometers to several tens of nanometers, which is extremely short. The resolution of light exposure with extreme ultraviolet rays is high and the depth of focus is large. For these reasons, the channel length (L) of the transistor to be formed later can be set to less than 2 μm, preferably in the range of 10 nm to 350 nm (0.35 μm), in which case the circuit can operate at higher speed.

Note that an insulating layer functioning as a base may be provided over the insulating layer 128. The insulating layer can be formed by a PVD method, a CVD method, or the like.

Next, the insulating layer 140 is formed so as to cover the source electrode 142a, the drain electrode 142b, and the electrode 142c. Then, in order to planarize the insulating layer 140, chemical mechanical polishing (CMP) treatment is performed so that the source electrode 142a, the drain electrode 142b, and the electrode 142c are exposed (see FIG. 11A).

The insulating layer 140 can be formed using an inorganic insulating material such as silicon oxide, silicon oxynitride, silicon nitride, aluminum oxide, or gallium oxide. It is particularly preferable that the insulating layer 140 be formed using, for example, silicon oxide or the like because the oxide semiconductor layer 144 formed later is in contact with the insulating layer 140. Note that in the case where the insulating layer 140 contains a Group 13 element such as gallium or aluminum which is highly likely to be contained in the oxide semiconductor layer 144, it is possible to improve characteristics at the interface between the insulating layer 140 and the oxide semiconductor layer 144, suppress hydrogen pile-up or the like, and stabilize electrical characteristics. Furthermore, the use of aluminum oxide for the insulating layer 140 also has the effect of suppressing entry of external water.

Note that it is preferable to use an oxide material in which the proportion of oxygen is slightly higher than that in the stoichiometric composition, for the insulating layer 140, in view of suppressing generation of defects due to oxygen vacancies in the oxide semiconductor layer 144. With the use of a material containing a high proportion of oxygen for a layer in contact with the oxide semiconductor layer 144, it is possible to supply oxygen to the oxide semiconductor layer 144, suppress generation of oxygen vacancy defects, and prevent a transistor from becoming normally on. This makes it possible to decrease a difference between potentials of a gate terminal and a source terminal (or a drain terminal), which is needed to sufficiently turn off the transistor. Accordingly, power consumption necessary for changing a potential can be suppressed. It becomes easier to operate the semiconductor device properly. In other words, in the case of employing this configuration, the effect of an embodiment of the present invention is more significant.

Although there is no particular limitation on the forming method of the insulating layer 140, in consideration of contact with the oxide semiconductor layer 144, a method in which hydrogen is sufficiently reduced is preferably employed.

Examples of such a method include a sputtering method and the like. Needless to say, another film formation method such as a plasma CVD method may be used. The forming method of the insulating layer 140, the treatment of the insulating layer 140, or the like may be devised so that the insulating layer 140 contains a high proportion of oxygen. For example, the insulating layer 140 containing a high proportion of oxygen can be realized by adding oxygen to a film formation atmosphere. The insulating layer 140 may be subjected to heat treatment in an oxygen atmosphere, oxygen plasma treatment, or the like. In any case, a semiconductor device with excellent characteristics can be realized by sufficiently reducing hydrogen in the insulating layer 140 and making the insulating layer 140 contain oxygen sufficiently.

The chemical mechanical polishing (CMP) treatment is performed so as to expose at least part of surfaces of the source electrode 142a, the drain electrode 142b, and the electrode 142c. In addition, the CMP treatment is preferably performed under such conditions that the root-mean-square (RMS) roughness of a surface of the insulating layer 140 becomes 1 nm or less (preferably 0.5 nm or less). By the CMP treatment performed under such conditions, the planarity of a surface where the oxide semiconductor layer 144 is formed later can be improved, and the characteristics of the transistor 162 can be improved.

Note that the CMP treatment may be performed only once or plural times. When the CMP treatment is performed plural times, it is preferable that first polishing be performed at a high polishing rate and final polishing be performed at a low polishing rate. By performing polishing at different polishing rates, the planarity of the surface of the insulating layer 140 can be further improved.

Figure 11B:
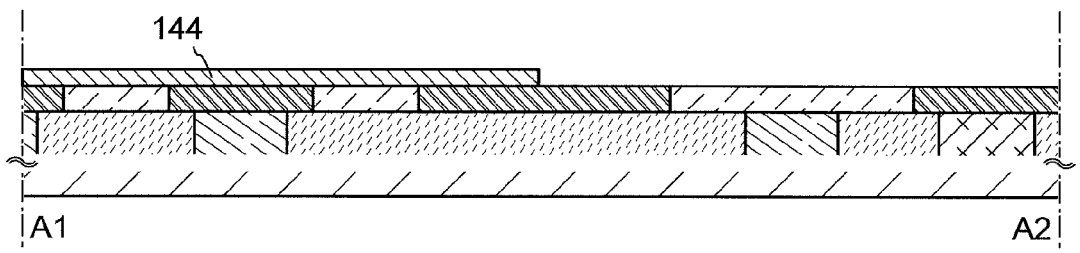

Next, the oxide semiconductor layer 144 is formed by forming an oxide semiconductor layer so as to be in contact with part of the upper surfaces of the source electrode 142a, the drain electrode 142b, and the insulating layer 140 and then by selectively etching the oxide semiconductor layer (see FIG. 11B).

The oxide semiconductor layer 144 contains at least one element selected from In, Ga, Sn, Zn, Al, Mg, Hf, and lanthanoid. For example, a four-component metal oxide such as an In—Sn—Ga—Zn—O-based oxide semiconductor, a three-component metal oxide such as an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, a Sn—Al—Zn—O-based oxide semiconductor, an In—Hf—Zn—O-based oxide semiconductor, an In—La—Zn—O-based oxide semiconductor, an In—Ce—Zn—O-based oxide semiconductor, an In—Pr—Zn—O-based oxide semiconductor, an In—Nd—Zn—O-based oxide semiconductor, an In—Pm—Zn—O-based oxide semiconductor, an In—Sm—Zn—O-based oxide semiconductor, an In—Eu—Zn—O-based oxide semiconductor, an In—Gd—Zn—O-based oxide semiconductor, an In—Tb—Zn—O-based oxide semiconductor, an In—Dy—Zn—O-based oxide semiconductor, an In—Ho—Zn—O-based oxide semiconductor, an In—Er—Zn—O-based oxide semiconductor, an In—Tm—Zn—O-based oxide semiconductor, an In—Yb—Zn—O-based oxide semiconductor, or an In—Lu—Zn—O-based oxide semiconductor, a two-component metal oxide such as an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, an In—Mg—O-based oxide semiconductor, or an In—Ga—O-based oxide semiconductor, a single-component metal oxide such as an In—O-based oxide semiconductor, a Sn—O-based oxide semiconductor, or a Zn—O-based oxide semiconductor, or the like can be used. In addition, any of the above oxide semiconductors may contain an element other than In, Ga, Sn, and Zn, for example, $SiO_2$.

For example, an In—Ga—Zn—O-based oxide semiconductor means an oxide semiconductor containing indium (In), gallium (Ga), and zinc (Zn), and there is no limitation on the composition ratio thereof.

In particular, an In—Ga—Zn—O-based oxide semiconductor material has sufficiently high resistance when there is no electric field and thus off-state current can be sufficiently reduced. In addition, with high field-effect mobility, the In—Ga—Zn—O-based oxide semiconductor material is suitable for a semiconductor device.

As a typical example of the In—Ga—Zn—O-based oxide semiconductor material, an oxide semiconductor material represented by $InGaO_3(ZnO)_m$ (m>0) is given. Using M instead of Ga, there is an oxide semiconductor material represented by $InMO_3(ZnO)_m$ (m>0). Here, M denotes one or more metal elements selected from gallium (Ga), aluminum (Al), iron (Fe), nickel (Ni), manganese (Mn), cobalt (Co), or the like. For example, M may be Ga, Ga and Al, Ga and Fe, Ga and Ni, Ga and Mn, Ga and Co, or the like. Note that the above-described compositions are derived from the crystal structures that the oxide semiconductor material can have and are mere examples.

In the case where an In—Zn—O-based material is used as an oxide semiconductor, a target therefor has a composition ratio of In:Zn=50:1 to 1:2 in an atomic ratio ($In_2O_3$:ZnO=25:1 to 1:4 in a molar ratio), preferably, In:Zn=20:1 to 1:1 in an atomic ratio ($In_2O_3$:ZnO=10:1 to 1:2 in a molar ratio), further preferably, In:Zn=15:1 to 1.5:1 in an atomic ratio ($In_2O_3$:ZnO=15:2 to 3:4 in a molar ratio). For example, in a target used for formation of an In—Zn—O-based oxide semiconductor which has an atomic ratio of In:Zn:O=X:Y:Z, the relation of Z>1.5X+Y is satisfied.

As a target used for forming the oxide semiconductor layer 144 by a sputtering method, a target having a composition ratio of In:Ga:Zn=1:x:y (x is greater than or equal to 0 and y is greater than or equal to 0.5 and less than or equal to 5) is preferably used. For example, a target having a composition ratio of $In_2O_3$:$Ga_2O_3$:ZnO=1:1:2 [molar ratio] or the like can be used. Furthermore, a target having a composition ratio of $In_2O_3$:$Ga_2O_3$:ZnO=1:1:1 [molar ratio] (x=1, y=0.5), a target having a composition ratio of $In_2O_3$:$Ga_2O_3$:ZnO=1:1:4 [molar ratio] (x=1, y=2), or a target having a composition ratio of $In_2O_3$:$Ga_2O_3$:ZnO=1:0:2 [molar ratio] (x=0, y=1) can also be used.

In this embodiment, an oxide semiconductor layer having an amorphous structure is formed as the oxide semiconductor layer 144 by a sputtering method with the use of an In—Ga—Zn—O-based metal oxide target. The thickness ranges from 1 nm to 50 nm, preferably from 2 nm to 20 nm, more preferably from 3 nm to 15 nm.

The relative density of the metal oxide in the metal oxide target is 80% or more, preferably 95% or more, and more preferably 99.9% or more. The use of the metal oxide target with high relative density makes it possible to form an oxide semiconductor layer having a dense structure.

The atmosphere in which the oxide semiconductor layer 144 is formed is preferably a rare gas (typically, argon) atmosphere, an oxygen atmosphere, or a mixed atmosphere containing a rare gas (typically, argon) and oxygen. Specifically, it is preferable to use a high-purity gas atmosphere, for example, from which an impurity such as hydrogen, water, a hydroxyl group, or hydride is removed to 1 ppm or less (preferably, 10 ppb or less).

In forming the oxide semiconductor layer 144, for example, an object to be processed is held in a treatment chamber that is maintained under reduced pressure, and the object to be processed is heated to a temperature higher than or equal to 100° C. and lower than 550° C., preferably higher than or equal to 200° C. and lower than or equal to 400° C. Alternatively, the temperature of an object to be processed in forming the oxide semiconductor layer 144 may be room temperature (25° C.±10° C. (higher than or equal to 15° C. and lower than or equal to 35° C.)). Then, moisture in the treatment chamber is removed, a sputtering gas from which hydrogen, water, or the like is removed is introduced, and the above-described target is used; thus, the oxide semiconductor layer 144 is formed. By forming the oxide semiconductor layer 144 while heating the object to be processed, an impurity in the oxide semiconductor layer 144 can be reduced. Moreover, damage due to sputtering can be reduced. In order to remove the moisture from the treatment chamber, it is preferable to use an entrapment vacuum pump. For example, a cryopump, an ion pump, a titanium sublimation pump, or the like can be used. A turbomolecular pump provided with a cold trap may be used. Since hydrogen, water, or the like can be removed from the treatment chamber evacuated with a cryopump or the like, the concentration of an impurity in the oxide semiconductor layer can be reduced.

For example, conditions for forming the oxide semiconductor layer 144 can be set as follows: the distance between the object to be processed and the target is 170 mm; the pressure is 0.4 Pa; the direct current (DC) power is 0.5 kW; and the atmosphere is an oxygen (100% oxygen) atmosphere, an argon (100% argon) atmosphere, or a mixed atmosphere of oxygen and argon. Note that a pulsed direct current (DC) power source is preferably used because dust (such as powder substances generated in film formation) can be reduced and the film thickness can be made uniform. The thickness of the oxide semiconductor layer 144 is set in the range of 1 nm to 50 nm, preferably 2 nm to 20 nm, more preferably 3 nm to 15 nm. By employing a structure according to the disclosed invention, a short-channel effect due to miniaturization can be suppressed even in the case of using the oxide semiconductor layer 144 having such a thickness. Note that the appropriate thickness of the oxide semiconductor layer differs depending on the oxide semiconductor material to be used, the intended use of the semiconductor device, or the like; therefore, the thickness can be determined as appropriate in accordance with the material, the intended use, or the like.

Note that when the insulating layer 140 is formed in the above manner, a surface over which a portion corresponding to the channel formation region in the oxide semiconductor layer 144 is to be formed can be sufficiently planarized; thus, an oxide semiconductor layer having a small thickness can also be suitably formed. As illustrated in FIG. 11B, the portion corresponding to the channel formation region in the oxide semiconductor layer 144 preferably has a planar cross-sectional shape. By making the cross-sectional shape of the portion corresponding to the channel formation region in the oxide semiconductor layer 144 flat, leakage current can be reduced as compared to the case where the cross-sectional shape of the oxide semiconductor layer 144 is not flat.

Note that before the oxide semiconductor layer 144 is formed by a sputtering method, reverse sputtering in which plasma is generated with an argon gas introduced may be performed so that a material attached to a formation surface (e.g., a surface of the insulating layer 140) is removed. Here, the reverse sputtering is a method in which ions collide with a surface to be processed so that the surface is modified, in contrast to normal sputtering in which ions collide with a sputtering target. An example of a method for making ions collide with a surface to be processed is a method in which high-frequency voltage is applied to the surface side in an argon atmosphere so that plasma is generated near the object to be processed. Note that an atmosphere of nitrogen, helium, oxygen, or the like may be used instead of an argon atmosphere.

After formation of the oxide semiconductor layer 144, heat treatment (first heat treatment) is preferably performed on the oxide semiconductor layer 144. Through the first heat treatment, excess hydrogen, water, a hydroxyl group, or the like in the oxide semiconductor layer 144 can be removed, the structure of the oxide semiconductor layer 144 can be ordered, and defect states in an energy gap can be reduced. For example, the temperature of the first heat treatment can be set higher than or equal to 300° C. and lower than 550° C., preferably higher than or equal to 400° C. and lower than or equal to 500° C.

For example, after an object to be processed is introduced into an electric furnace including a resistance heater or the like, the heat treatment can be performed at 450° C. for one hour in a nitrogen atmosphere. The oxide semiconductor layer is not exposed to the air during the heat treatment so that entry of water or hydrogen can be prevented.

The heat treatment apparatus is not limited to the electric furnace and may be an apparatus for heating an object to be processed by thermal radiation or thermal conduction from a medium such as a heated gas. For example, a rapid thermal annealing (RTA) apparatus such as a lamp rapid thermal annealing (LRTA) apparatus or a gas rapid thermal annealing (GRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for performing heat treatment using a high-temperature gas. As the gas, an inert gas that does not react with an object to be processed by heat treatment, for example, nitrogen or a rare gas such as argon is used.

For example, as the first heat treatment, GRTA treatment may be performed as follows. The object to be processed is put in a heated inert gas atmosphere, heated for several minutes, and taken out of the inert gas atmosphere. The GRTA treatment enables high-temperature heat treatment in a short time. Moreover, the GRTA treatment can be employed even when the temperature exceeds the upper temperature limit of the object to be processed. Note that the inert gas may be switched to a gas including oxygen during the treatment. This is because defect states in an energy gap caused by oxygen vacancies can be reduced by performing the first heat treatment in an atmosphere including oxygen.

Note that as the inert gas atmosphere, an atmosphere that contains nitrogen or a rare gas (e.g., helium, neon, or argon) as its main component and does not contain water, hydrogen, or the like is preferably used. For example, the purity of nitrogen or a rare gas such as helium, neon, or argon introduced into a heat treatment apparatus is set to 6N (99.9999%) or more, preferably 7N (99.99999%) or more (i.e., the impurity concentration is 1 ppm or less, preferably 0.1 ppm or less).

In any case, a transistor with extremely excellent characteristics can be obtained with the use of the oxide semiconductor layer which is an i-type (intrinsic) or substantially i-type oxide semiconductor layer obtained by reducing an impurity through the first heat treatment.

The above heat treatment (the first heat treatment) can also be referred to as dehydration treatment, dehydrogenation treatment, or the like because it has the effect of removing hydrogen, water, or the like. The dehydration treatment or the dehydrogenation treatment can be performed after the oxide semiconductor layer 144 is formed, after the gate insulating layer 146 is formed later, or after a gate electrode is formed. Such dehydration treatment or dehydrogenation treatment may be conducted once or plural times.

The etching of the oxide semiconductor layer 144 may be performed either before the heat treatment or after the heat treatment. Dry etching is preferably used in terms of element miniaturization, but wet etching may be used. An etching gas or an etchant can be selected as appropriate depending on a material to be etched. Note that in the case where leakage in an element or the like does not cause a problem, the oxide semiconductor layer does not necessarily need to be processed in an island shape.

Figure 11C:
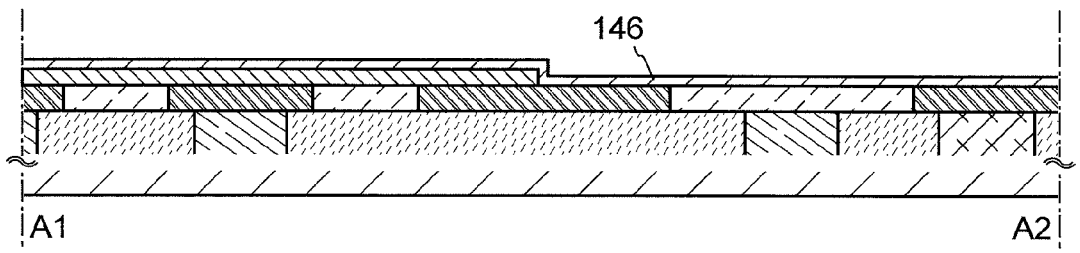

Next, the gate insulating layer 146 is formed so as to cover the oxide semiconductor layer 144 (see FIG. 11C).

The gate insulating layer 146 can be formed by a CVD method, a sputtering method, or the like. The gate insulating layer 146 is preferably formed so as to contain silicon oxide, silicon nitride, silicon oxynitride, aluminum oxide, gallium oxide, tantalum oxide, hafnium oxide, yttrium oxide, hafnium silicate (HfSi$_x$O$_y$ (x>0, y>0)), hafnium silicate to which nitrogen is added (HfSi$_x$O$_y$N$_z$(x>0, y>0, z>0)), hafnium aluminate to which nitrogen is added (HfAl$_x$O$_y$N$_z$ (x>0, y>0, z>0)), or the like.

Note that in the case where the gate insulating layer 146 contains a Group 13 element such as gallium or aluminum which is highly likely to be contained in the oxide semiconductor layer 144, it is possible to improve characteristics at the interface between the gate insulating layer 146 and the oxide semiconductor layer 144, suppress hydrogen pile-up or the like, and stabilize electrical characteristics. Furthermore, the use of aluminum oxide for the gate insulating layer 146 also has the effect of being capable of suppressing entry of external water.

Note that it is preferable to use an oxide material in which the proportion of oxygen is slightly higher than that in the stoichiometric composition, for the gate insulating layer 146, in view of suppressing generation of defects due to oxygen vacancies in the oxide semiconductor layer 144. With the use of a material containing a higher proportion of oxygen for a layer in contact with the oxide semiconductor layer 144, it is possible to supply oxygen to the oxide semiconductor layer 144, suppress generation of oxygen vacancy defects, and prevent a transistor from becoming normally on. This makes it possible to decrease a difference between potentials of a gate terminal and a source terminal (or a drain terminal), which is needed to sufficiently turn off the transistor. Accordingly, power consumption necessary for changing a potential can be suppressed. It becomes easier to operate the semiconductor device properly. In other words, in the case of employing this configuration, the effect of an embodiment of the present invention is more significant.

Note that the gate insulating layer 146 is preferably formed by a method in which hydrogen is sufficiently reduced. The forming method of the gate insulating layer 146, the treatment of the gate insulating layer 146, or the like may be devised so that the gate insulating layer 146 contains a high proportion of oxygen. For example, the gate insulating layer 146 containing a high proportion of oxygen can be realized by adding oxygen to a film formation atmosphere. The gate insulating layer 146 may be subjected to heat treatment in an oxygen atmosphere, oxygen plasma treatment, or the like. In any case, a semiconductor device with excellent characteristics can be realized by sufficiently reducing hydrogen in the gate insulating layer 146 and making the gate insulating layer 146 contain oxygen sufficiently.

The gate insulating layer 146 may have a single-layer structure or a stacked-layer structure. There is no particular limitation on the thickness of the gate insulating layer 146; the thickness is preferably small in order to ensure the operation of the transistor when the semiconductor device is miniaturized. For example, in the case of using silicon oxide, the thickness can be in the range of 1 nm to 100 nm, preferably 10 nm to 50 nm.

When the gate insulating layer is thin as described above, gate leakage due to a tunneling effect or the like becomes a problem. In order to solve the problem of gate leakage, the gate insulating layer 146 may be formed using a high dielectric constant (high-k) material such as hafnium oxide, tantalum oxide, yttrium oxide, hafnium silicate (HfSi$_x$O$_y$(x>0, y>0)), hafnium silicate to which nitrogen is added (HfSi$_x$O$_y$N$_z$(x>0, y>0, z>0)), hafnium aluminate to which nitrogen is added (HfAl$_x$O$_y$N$_z$(x>0, y>0, z>0)). The use of a high-k material for the gate insulating layer 146 makes it possible to increase the thickness in order to suppress gate leakage as well as ensuring electrical properties. For example, the relative permittivity of hafnium oxide is approximately 15, which is much higher than that of silicon oxide which is 3 to 4. With such a material, a gate insulating layer where the equivalent oxide thickness is less than 15 nm, preferably 2 nm to 10 nm, can be easily formed. Note that a stacked-layer structure of a film including a high-k material and a film including any of silicon oxide, silicon nitride, silicon oxynitride, silicon nitride oxide, aluminum oxide, gallium oxide, and the like may also be employed.

After the gate insulating layer 146 is formed, second heat treatment is preferably performed in an inert gas atmosphere or an oxygen atmosphere. The temperature of the heat treatment is set in the range of 200° C. to 450° C., preferably 250° C. to 350° C. For example, the heat treatment may be performed at 250° C. for one hour in a nitrogen atmosphere. By the second heat treatment, variation in electrical characteristics of the transistor can be reduced. In the case where the gate insulating layer 146 contains oxygen, oxygen can be supplied to the oxide semiconductor layer 144 and oxygen vacancies in the oxide semiconductor layer 144 can be filled; thus, the oxide semiconductor layer which is i-type (intrinsic) or substantially i-type can also be formed.

Note that the second heat treatment is performed in this embodiment after the gate insulating layer 146 is formed; there is no limitation on the timing of the second heat treatment. For example, the second heat treatment may be performed after the gate electrode is formed. Alternatively, the first heat treatment and the second heat treatment may be performed in succession, or the first heat treatment may double as the second heat treatment, or the second heat treatment may double as the first heat treatment.

By performing at least one of the first heat treatment and the second heat treatment as described above, the oxide semiconductor layer 144 can be purified so as to contain impurities other than main components as little as possible.

Figure 11D:
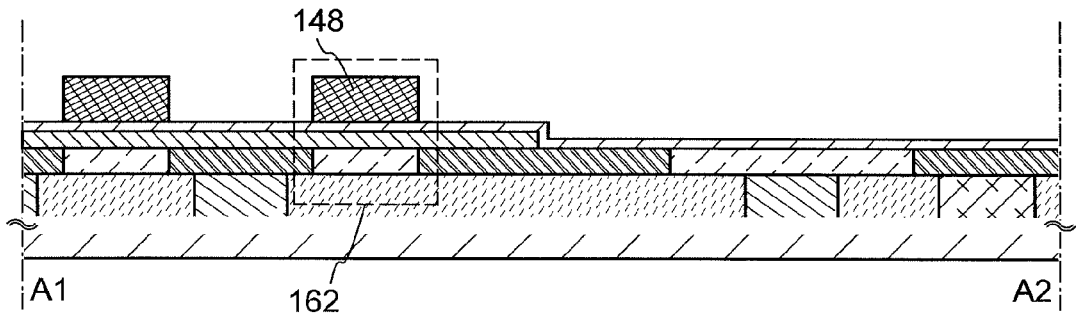

Next, the gate electrode 148 is formed over the gate insulating layer 146 (see FIG. 11D).

The gate electrode 148 can be formed by forming a conductive layer over the gate insulating layer 146 and then by selectively etching the conductive layer. The conductive layer to be the gate electrode 148 can be formed by a PVD method such as a sputtering method, or a CVD method such as a plasma CVD method. The details are similar to those in the case of the source electrode 142a, the drain electrode 142b, or the like; thus, the description thereof can be referred to.

Through the above steps, the transistor 162 including the oxide semiconductor layer 144, which is purified, is completed (see FIG. 11D). The transistor 162 as described above has the feature of sufficiently small off-state current. Therefore, with the use of the transistor as a writing transistor, charge can be held for a long time.

Figure 12A:
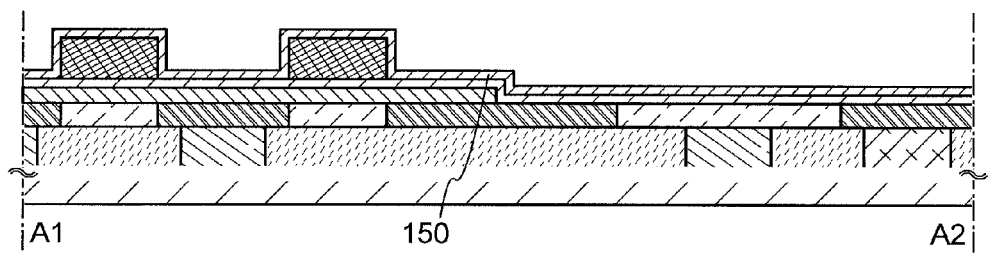
FIGS. 12A to 12D are cross-sectional views illustrating a manufacturing process of a semiconductor device.

Then, the insulating layer 150 is formed over the gate insulating layer 146 and the gate electrode 148 (see FIG. 12A). The insulating layer 150 can be formed by a PVD method, a CVD method, or the like. The insulating layer 150 can be formed so as to have a single-layer structure or a stacked-layer structure using a material including an inorganic insulating material such as silicon oxide, silicon oxynitride, silicon nitride, hafnium oxide, or aluminum oxide.

Note that the insulating layer 150 is preferably formed using a low dielectric constant material or a low dielectric constant structure (such as a porous structure). This is because when the insulating layer 150 has a low dielectric constant, capacitance generated between wirings, electrodes, or the like can be reduced and operation at higher speed can be achieved.

Note that in the case where a structure is employed in which the capacitor 164 does not include the gate insulating layer 146, the gate insulating layer 146 over the source electrode 142a and in a region where the capacitor 164 is to be formed may be removed before the insulating layer 150 is formed.

Figure 12B:
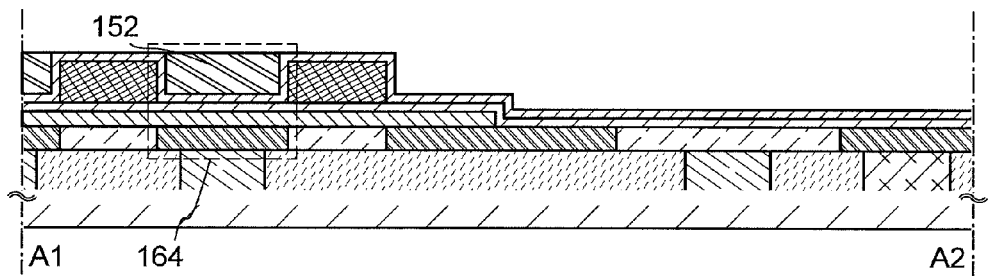

Next, the electrode 152 is formed over the insulating layer 150 so as to overlap with the source electrode 142a (see FIG. 12B). The method and materials for forming the gate electrode 148 can be applied to the electrode 152; therefore, the description of the gate electrode 148 can be referred to for the details of the electrode 152. Through the above steps, the capacitor 164 is completed.

Figure 12C:
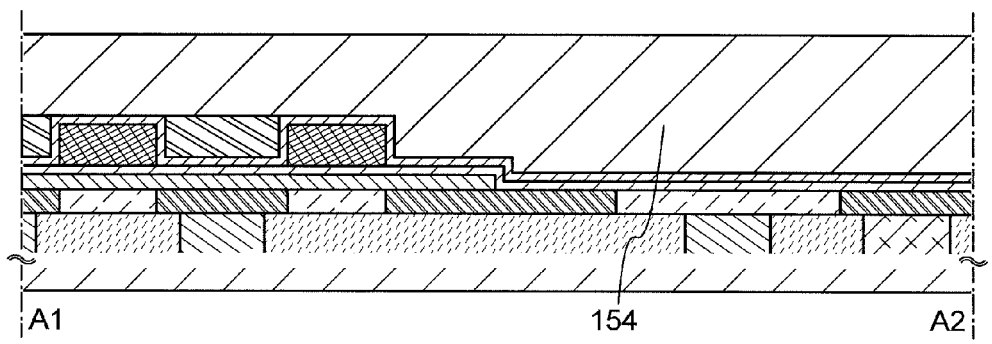
Figure 12D:
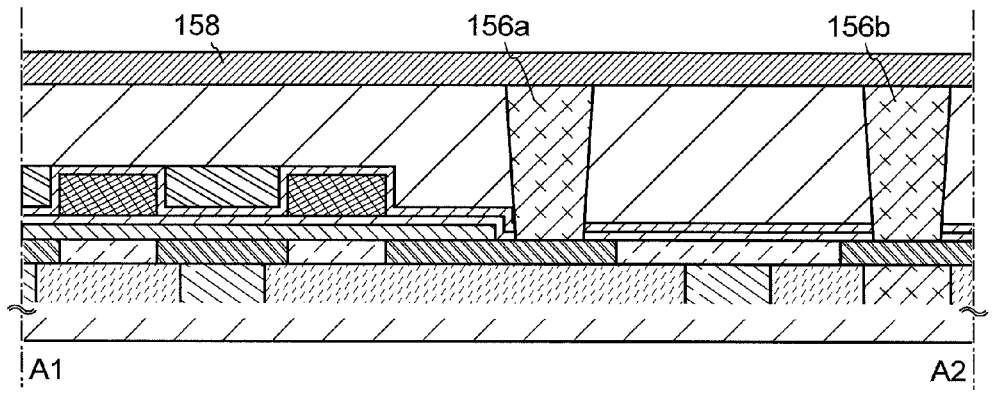

Next, the insulating layer 154 is formed over the insulating layer 150 and the electrode 152 (see FIG. 12C). Like the insulating layer 150, the insulating layer 154 can be formed by a PVD method, a CVD method, or the like. The insulating layer 154 can be formed so as to have a single-layer structure or a stacked-layer structure using a material including an inorganic insulating material such as silicon oxide, silicon oxynitride, silicon nitride, hafnium oxide, or aluminum oxide.

Note that the insulating layer 154 is preferably formed using a low dielectric constant material or a low dielectric constant structure (such as a porous structure). This is because when the insulating layer 154 has a low dielectric constant, capacitance generated between wirings, electrodes, or the like can be reduced and operation at higher speed can be achieved.

Note that the insulating layer 154 is desirably formed so as to have a flat surface. This is because when the insulating layer 154 has a flat surface, an electrode, a wiring, or the like can be favorably formed over the insulating layer 154 even in the case where the semiconductor device or the like is miniaturized. Note that the insulating layer 154 can be planarized using a method such as chemical mechanical polishing (CMP).

Next, an opening reaching the drain electrode 142b and an opening reaching the electrode 142c are formed in the gate insulating layer 146, the insulating layer 150, and the insulating layer 154. After that, the electrode 156a and the electrode 156b are formed in the openings, and the wiring 158 is formed over the insulating layer 154 to be in contact with the electrode 156a and the electrode 156b (see FIG. 12D). The openings are formed by selective etching with a mask or the like.

The electrode 156a and the electrode 156b can be formed in such a manner, for example, that a conductive layer is formed in regions including the openings by a PVD method, a CVD method, or the like and then part of the conductive layer is removed by etching, CMP, or the like.

Specifically, it is possible to employ a method, for example, in which a thin titanium film is formed in regions including the openings by a PVD method and a thin titanium nitride film is formed by a CVD method, and then, a tungsten film is formed so as to be embedded in the openings. Here, the titanium film formed by a PVD method functions to reduce an oxide film (e.g., a natural oxide film) formed on a surface where the titanium film is formed, and to decrease the contact resistance with a lower electrode or the like (here, the drain electrode 142b). The titanium nitride film formed after the formation of the titanium film has a barrier function for suppressing diffusion of the conductive material. A copper film may be formed by a plating method after the formation of a barrier film of titanium, titanium nitride, or the like.

The wiring 158 is formed by forming a conductive layer by a PVD method such as a sputtering method, or a CVD method such as a plasma CVD method, and then by patterning the conductive layer. As a material of the conductive layer, an element selected from aluminum, chromium, copper, tantalum, titanium, molybdenum, and tungsten, an alloy including any of these elements as a component, or the like can be used. A material including one of manganese, magnesium, zirconium, beryllium, neodymium, and scandium or a combination of a plurality of these elements may be used. The details are similar to those of the source electrode 142a and the like.

Note that a variety of wirings, electrodes, or the like may be formed after the above steps. The wirings or the electrodes can be formed by a method such as a so-called damascene method or dual damascene method.

Through the above steps, the semiconductor device having the structure illustrated in FIGS. 6A and 6B can be manufactured.

In the transistor 162 described in this embodiment, the oxide semiconductor layer 144 is purified and thus contains hydrogen at a concentration of $5\times10^{19}$ atoms/cm$^3$ or less, preferably $5\times10^{18}$ atoms/cm$^3$ or less, more preferably $5\times10^{17}$ atoms/cm$^3$ or less. In addition, the carrier density of the oxide semiconductor layer 144 is, for example, less than $1\times10^{12}$/cm$^3$, preferably less than $1.45\times10^{10}$/cm$^3$, which is sufficiently lower than the carrier density of a general silicon wafer (approximately $1\times10^{14}$/cm$^3$). In addition, the off-state current of the transistor 162 is sufficiently small. For example, the off-state current (per unit channel width (1 μm), here) of the transistor 162 at room temperature (25° C.) is 100 zA (1 zA (zeptoampere) is $1\times10^{-21}$ A) or less, preferably 10 zA or less.

In this manner, by using the oxide semiconductor layer 144 which is purified and is intrinsic, it becomes easy to sufficiently reduce the off-state current of the transistor 162. With the use of the transistor 162 as described above, a semiconductor device in which stored data can be held for an extremely long time can be provided.

In the semiconductor device described in this embodiment, the transistors each including an oxide semiconductor in the memory cells of the semiconductor device are connected in series; thus, the source electrode of the transistor including an oxide semiconductor in the memory cell and the drain electrode of the transistor including an oxide semiconductor in the adjacent memory cell can be connected to each other. That is, in each memory cell, one of the source electrode and the drain electrode of the transistor including an oxide semiconductor does not need to be connected to a wiring through an opening. Therefore, the area occupied by the memory cells can be reduced, whereby the degree of integration of the semiconductor device can be increased and the storage capacity per unit area can be increased.

The configurations, methods, and the like described in this embodiment can be combined as appropriate with any of the configurations, methods, and the like described in the other embodiments.

Embodiment 3

In this embodiment, the cases where the semiconductor device described in any of the above embodiments is applied to electronic devices will be described with reference to FIGS. 13A to 13F. The cases where the above-described semiconductor device is applied to electronic devices such as a computer, a mobile phone set (also referred to as a mobile phone or a mobile phone device), a portable information terminal (including a portable game machine, an audio reproducing device, and the like), a digital camera, a digital video camera, electronic paper, a television set (also referred to as a television or a television receiver), and the like are described in this embodiment.

Figure 13A:
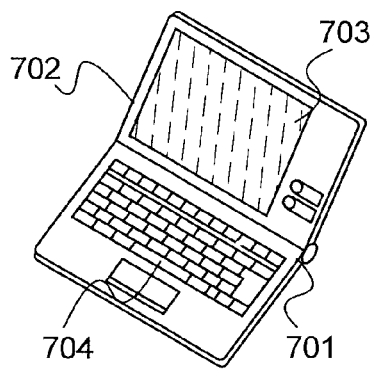
FIGS. 13A to 13F each illustrate an electronic device including a semiconductor device.

FIG. 13A illustrates a notebook personal computer, which includes a housing 701, a housing 702, a display portion 703, a keyboard 704, and the like. A memory circuit is provided inside the housings 701 and 702, and the memory circuit includes the semiconductor device described in any of the above embodiments. Thus, a notebook personal computer with sufficiently low power consumption, in which writing and reading of data can be performed at high speed and data can be stored for a long time, can be realized.

Figure 13D:
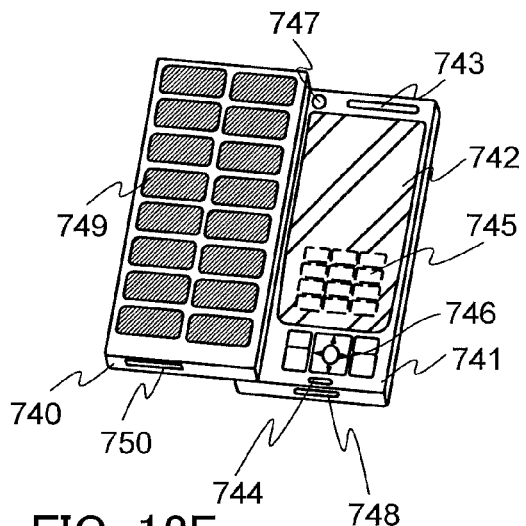
Figure 13B:
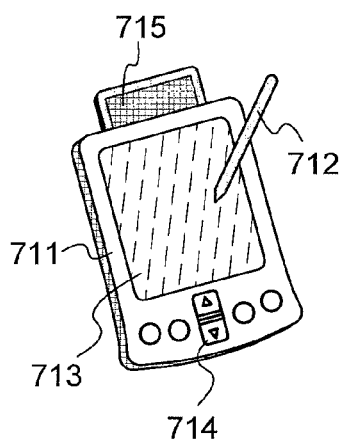

FIG. 13B illustrates a portable information terminal (PDA). A main body 711 is provided with a display portion 713, an external interface 715, operation buttons 714, and the like. Further, a stylus 712 for operation of the portable information terminal, or the like is provided. A memory circuit is provided inside the main body 711, and the memory circuit includes the semiconductor device described in any of the above embodiments. Thus, a portable information terminal with sufficiently low power consumption, in which writing and reading of data can be performed at high speed and data can be stored for a long time, can be realized.

Figure 13E:
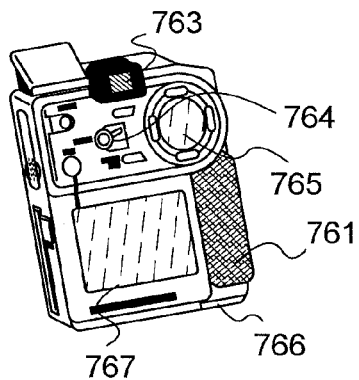
Figure 13C:
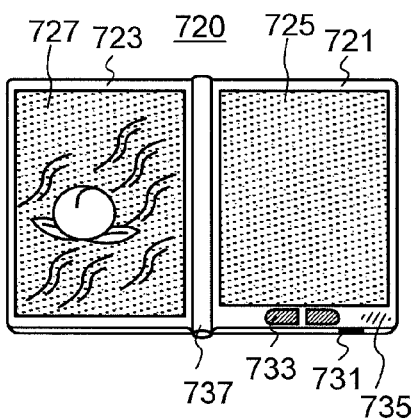

FIG. 13C illustrates an electronic book 720 incorporating electronic paper, which includes two housings, a housing 721 and a housing 723. The housing 721 and the housing 723 include a display portion 725 and a display portion 727, respectively. The housing 721 is connected to the housing 723 by a hinge 737, so that the electronic book can be opened and closed using the hinge 737 as an axis. In addition, the housing 721 is provided with a power switch 731, operation keys 733, a speaker 735, and the like. A memory circuit is provided inside at least one of the housings 721 and 723, and the memory circuit includes the semiconductor device described in any of the above embodiments. Thus, an electronic book with sufficiently low power consumption, in which writing and reading of data can be performed at high speed and data can be stored for a long time, can be realized.

FIG. 13D illustrates a mobile phone set, which includes two housings, a housing 740 and a housing 741. Moreover, the housings 740 and 741 in a state where they are developed as illustrated in FIG. 13D can be slid so that one is lapped over the other. Therefore, the size of the mobile phone set can be reduced, which makes the mobile phone set suitable for being carried around. The housing 741 includes a display panel 742, a speaker 743, a microphone 744, operation keys 745, a pointing device 746, a camera lens 747, an external connection terminal 748, and the like. The housing 740 includes a solar cell 749 for charging the mobile phone set, an external memory slot 750, and the like. An antenna is incorporated in the housing 741. A memory circuit is provided inside at least one of the housings 740 and 741, and the memory circuit includes the semiconductor device described in any of the above embodiments. Thus, a mobile phone set with sufficiently low power consumption, in which writing and reading of data can be performed at high speed and data can be stored for a long time, can be realized.

FIG. 13E illustrates a digital camera, which includes a main body 761, a display portion 767, an eyepiece 763, an operation switch 764, a display portion 765, a battery 766, and the like. A memory circuit is provided inside the main body 761, and the memory circuit includes the semiconductor device described in any of the above embodiments. Thus, a digital camera with sufficiently low power consumption, in which writing and reading of data can be performed at high speed and data can be stored for a long time, can be realized.

Figure 13F:
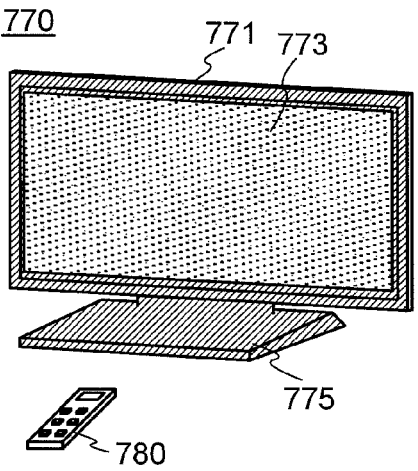

FIG. 13F is a television set 770, which includes a housing 771, a display portion 773, a stand 775, and the like. The television set 770 can be operated with a switch included in the housing 771 or with a remote controller 780. A memory circuit is provided inside the housing 771 and the remote controller 780, and the memory circuit includes the semiconductor device described in any of the above embodiments. Thus, a television set with sufficiently low power consumption, in which writing and reading of data can be performed at high speed and data can be stored for a long time, can be realized.

As described above, the electronic devices described in this embodiment each include the semiconductor device according to any of the above embodiments. Therefore, electronic devices with low power consumption can be realized.

EXPLANATION OF REFERENCE

100: substrate, 102: protective layer, 104: semiconductor region, 106: element isolation insulating layer, 108: gate insulating layer, 108a: gate insulating layer, 108b: gate insulating layer, 110: gate electrode, 110a: gate electrode, 110b: gate electrode, 116: channel formation region, 116a: channel formation region, 116b: channel formation region, 120: impurity region, 120a: impurity region, 120b: impurity region, 120c: impurity region, 122: metal layer, 124: metal compound region, 124a: metal compound region, 124b: metal compound region, 124c: metal compound region, 126: electrode, 128: insulating layer, 140: insulating layer, 142a: source electrode, 142b: drain electrode, 142c: electrode, 144: oxide semiconductor layer, 146: gate insulating layer, 148: gate electrode, 150: insulating layer, 152: electrode, 154: insulating layer, 156a: electrode, 156b: electrode, 158: wiring, 159a: electrode, 159b: electrode, 160: transistor, 162: transistor, 164: capacitor, 170: base substrate, 172: nitrogen-containing layer, 174: oxide film, 180: selection transistor, 182: selection transistor, 190: memory cell, 701: housing, 702: housing, 703: display portion, 704: keyboard, 711: main body, 712: stylus, 713: display portion, 714: operation button, 715: external interface, 720: electronic book, 721: housing, 723: housing, 725: display portion, 727: display portion, 731: power switch, 733: operation key, 735: speaker, 737: hinge, 740: housing, 741: housing, 742: display panel, 743: speaker, 744: microphone, 745: operation key, 746: pointing device, 747: camera lens, 748: external connection terminal, 749: solar cell, 750: external memory slot, 761: main body, 763: eyepiece, 764: operation switch, 765: display portion, 766: battery, 767: display portion, 770: television set, 771: housing, 773: display portion, 775: stand, and 780: remote controller.

This application is based on Japanese Patent Application serial no. 2010-142196 filed with Japan Patent Office on Jun. 23, 2010, the entire contents of which are hereby incorporated by reference.

The invention claimed is:

1. A semiconductor device comprising:
a source line;
a bit line; and
first to m-th memory cells electrically connected in series between the source line and the bit line,
wherein each of the first to m-th memory cells comprises:
a first transistor including a first gate terminal, a first source terminal, and a first drain terminal;
a second transistor including a second gate terminal, a second source terminal, and a second drain terminal; and
a capacitor,
wherein a second source terminal of a k-th (k is a natural number greater than or equal to 1 and less than or equal to m) memory cell is electrically connected to a second drain terminal of a memory cell adjacent to the k-th memory cell, or a second drain terminal of the k-th memory cell is electrically connected to a second source terminal of a memory cell adjacent to the k-th memory cell,
wherein a first gate terminal of the k-th memory cell, the second source terminal of the k-th memory cell, and one of terminals of a capacitor of the k-th memory cell are electrically connected to each other and form a node of the k-th memory cell, and
wherein the node of the k-th memory cell is supplied with a potential higher than a potential of the second gate terminal of the k-th memory cell in a data holding period in which the second gate terminal is supplied with a potential at which the second transistor is turned off.

2. The semiconductor device according to claim 1, wherein the first transistor and the second transistor comprise semiconductor regions containing different semiconductor materials as respective main components.

3. The semiconductor device according to claim 1, wherein the second transistor comprises a semiconductor region containing a metal oxide as a main component.

4. The semiconductor device according to claim 1, wherein the node of the memory cell adjacent to the k-th memory cell is supplied with a potential higher than a potential of the second gate terminal of the memory cell adjacent to the k-th memory cell in the data holding period.

5. The semiconductor device according to claim 1, wherein the second gate terminal of the k-th memory cell is supplied with a ground potential in the data holding period.

6. The semiconductor device according to claim 1, wherein the node of the k-th memory cell is supplied with a positive potential in the data holding period.

7. The semiconductor device according to claim 1, wherein the second gate terminal of the k-th memory cell and the node of the k-th memory cell are supplied with a potential at which an amount of current flowing in the second transistor of the k-th memory cell is 1 zA or less, in the data holding period.

8. The semiconductor device according to claim 1, wherein the first memory cell or the m-th memory cell is used as a dummy cell.

9. The semiconductor device according to claim 1, wherein a first source terminal of the k-th (k is a natural number greater than or equal to 1 and less than or equal to m) memory cell is electrically connected to a first drain terminal of the memory cell adjacent to the k-th memory cell, or a first drain terminal of the k-th memory cell is electrically connected to a first source terminal of the memory cell adjacent to the k-th memory cell.

10. A semiconductor device comprising:
a source line;
a bit line; and
first to m-th memory cells electrically connected in series between the source line and the bit line,
wherein each of the first to m-th memory cells comprises:
a first transistor including a first gate terminal, a first source terminal, and a first drain terminal;
a second transistor including a second gate terminal, a second source terminal, and a second drain terminal; and
a capacitor,
wherein a second source terminal of a k-th (k is a natural number greater than or equal to 1 and less than or equal to m) memory cell is electrically connected to a second drain terminal of a memory cell adjacent to the k-th memory cell, or a second drain terminal of the k-th memory cell is electrically connected to a second source terminal of a memory cell adjacent to the k-th memory cell,
wherein a first gate terminal of the k-th memory cell, the second source terminal of the k-th memory cell, and one of terminals of a capacitor of the k-th memory cell are electrically connected to each other, and
wherein a capacitance of the capacitor included in the first memory cell or the m-th memory cell is larger than a capacitance of the capacitor included in any of the second to (m−1)-th memory cells.

11. The semiconductor device according to claim 10, wherein the first transistor and the second transistor comprise semiconductor regions containing different semiconductor materials as respective main components.

12. The semiconductor device according to claim 10, wherein the second transistor comprises a semiconductor region containing a metal oxide as a main component.

13. The semiconductor device according to claim 10, wherein a first source terminal of the k-th (k is a natural number greater than or equal to 1 and less than or equal to m) memory cell is electrically connected to a first drain terminal of the memory cell adjacent to the k-th memory cell, or a first drain terminal of the k-th memory cell is electrically connected to a first source terminal of the memory cell adjacent to the k-th memory cell.

14. A semiconductor device comprising:
a source line;
a bit line; and
first to m-th memory cells electrically connected in series between the source line and the bit line,
wherein each of the first to m-th memory cells comprises:
a first transistor including a first gate terminal, a first source terminal, and a first drain terminal;
a second transistor including a second gate terminal, a second source terminal, and a second drain terminal; and
a capacitor,
wherein a second source terminal of a k-th (k is a natural number greater than or equal to 1 and less than or equal to m) memory cell is electrically connected to a second drain terminal of a memory cell adjacent to the k-th memory cell, or a second drain terminal of the k-th memory cell is electrically connected to a second source terminal of a memory cell adjacent to the k-th memory cell, wherein a first gate terminal of the k-th memory cell, the second source terminal of the k-th memory cell, and one of terminals of a capacitor of the k-th memory cell are electrically connected to each other, and wherein a channel length of the second transistor included in the first memory cell or the m-th memory cell is longer than a channel length of the second transistor included in any of the second to (m−1)-th memory cells.

15. The semiconductor device according to claim 14, wherein the first transistor and the second transistor comprise semiconductor regions containing different semiconductor materials as respective main components.

16. The semiconductor device according to claim 14, wherein the second transistor comprises a semiconductor region containing a metal oxide as a main component.

17. The semiconductor device according to claim 14, wherein a first source terminal of the k-th (k is a natural number greater than or equal to 1 and less than or equal to m) memory cell is electrically connected to a first drain terminal of the memory cell adjacent to the k-th memory cell, or a first drain terminal of the k-th memory cell is electrically connected to a first source terminal of the memory cell adjacent to the k-th memory cell.

* * * * *

UNITED STATES PATENT AND TRADEMARK OFFICE
CERTIFICATE OF CORRECTION

PATENT NO. : 8,619,470 B2  
APPLICATION NO. : 13/161616  
DATED : December 31, 2013  
INVENTOR(S) : Kiyoshi Kato Page 1 of 2

It is certified that error appears in the above-identified patent and that said Letters Patent is hereby corrected as shown below:

In the Specification

Column 8, line 14, replace "C1C2" with --$C1 \geq C2$--;

Column 8, line 61, replace "$\in r1$" with --$\varepsilon r1$--;

Column 8, line 63, replace "$\in r2$" with --$\varepsilon r2$--;

Column 9, line 9, replace "$\in r1$" with --$\varepsilon r1$--;

Column 9, line 13, before "$\leq 4$" replace "$\in r2$" with --$\varepsilon r2$-- and before "is" replace "$\in r2$" with --$\varepsilon r2$--;

Column 9, line 60, after "of" replace "in" with --*m*--;

Column 10, line 14, after "to" replace "in" with --*m*--;

Column 11, line 46, before "the" replace "FG" with --FG,--;

Column 11, line 47, before "the" replace "FG" with --FG,--;

Column 21, line 22, replace "faulted" with --formed--;

Column 22, line 25, replace "SOT" with --SOI--;

Column 22, line 31, replace "SOT" with --SOI--;

Column 22, line 32, replace "SOT" with --SOI--;

Column 23, line 48, replace "faulted" with --formed--;

Column 26, line 36, replace "fanned" with --formed--;

Signed and Sealed this  
Sixteenth Day of September, 2014

Michelle K. Lee  
*Deputy Director of the United States Patent and Trademark Office*

Column 28, line 20, replace "InGaO$_3$(ZnO)," with --InGaO$_3$(ZnO)$_m$--;

Column 34, line 48, replace "1 45×10$^{10}$/ cm$^3$" with --1.45×10$^{10}$/cm$^3$--.